(12) United States Patent
Chiang et al.

(10) Patent No.: US 12,406,941 B2
(45) Date of Patent: Sep. 2, 2025

(54) DIELECTRIC SLOTS UNDERNEATH CONDUCTIVE VIAS IN INTERCONNECT STRUCTURE OF SEMICONDUCTOR PACKAGE AND METHOD OF FORMING THE SAME

(71) Applicant: Taiwan Semiconductor Manufacturing Co., Ltd., Hsinchu (TW)

(72) Inventors: Yi-Che Chiang, Hsinchu (TW); Chien-Hsun Chen, Zhutian Township (TW); Tuan-Yu Hung, Huatan Township (TW); Hsin-Yu Pan, Taipei (TW); Wei-Kang Hsieh, Tainan (TW); Tsung-Hsien Chiang, Hsinchu (TW); Chao-Hsien Huang, Kaohsiung (TW); Tzu-Sung Huang, Tainan (TW); Ming Hung Tseng, Toufen Township (TW); Wei-Chih Chen, Taipei (TW); Ban-Li Wu, Hsinchu (TW); Hao-Yi Tsai, Hsinchu (TW); Yu-Hsiang Hu, Hsinchu (TW); Chung-Shi Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 501 days.

(21) Appl. No.: 17/752,272

(22) Filed: May 24, 2022

(65) Prior Publication Data
US 2023/0223357 A1 Jul. 13, 2023

Related U.S. Application Data

(60) Provisional application No. 63/266,523, filed on Jan. 7, 2022.

(51) Int. Cl.
*H01L 23/00* (2006.01)
*H01L 21/48* (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
None
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |

(Continued)

FOREIGN PATENT DOCUMENTS

| | | |
|---|---|---|
| TW | 201830639 A | 8/2018 |
| TW | 201836109 A | 10/2018 |
| TW | 201911503 A | 3/2019 |

*Primary Examiner* — Nduka E Ojeh
(74) *Attorney, Agent, or Firm* — Slater Matsil, LLP

(57) ABSTRACT

A method of manufacturing a semiconductor package includes depositing a first dielectric layer over a carrier substrate. A first metallization pattern is formed over the first dielectric layer. The first metallization pattern has a first opening exposing the first dielectric layer. A second dielectric layer is deposited over the first metallization pattern, forming a dielectric slot through the first metallization pattern by filling the first opening. A second metallization pattern and a third dielectric layer are formed over the second dielectric layer. A through via is formed over the third dielectric layer, so that the dielectric slot is laterally under the through via.

20 Claims, 55 Drawing Sheets

(51) Int. Cl.
   *H01L 21/56*   (2006.01)
   *H01L 21/683*  (2006.01)
   *H01L 23/31*   (2006.01)
   *H01L 23/538*  (2006.01)
   *H01L 25/10*   (2006.01)

(52) U.S. Cl.
   CPC .......... *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 25/105* (2013.01); *H01L 2221/68359* (2013.01); *H01L 2224/214* (2013.01); *H01L 2225/1035* (2013.01); *H01L 2225/1058* (2013.01); *H01L 2924/3511* (2013.01); *H01L 2924/35121* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,972,581 B1 | 5/2018 | Yu et al. |
| 10,162,139 B1 | 12/2018 | Wang et al. |
| 2017/0228529 A1* | 8/2017 | Huang ................ H01L 23/3114 |
| 2018/0269139 A1 | 9/2018 | Chiang et al. |
| 2020/0343193 A1* | 10/2020 | Hsieh ................ H01L 23/5384 |
| 2020/0365421 A1* | 11/2020 | Liu ........................ H01L 21/561 |
| 2021/0151370 A1* | 5/2021 | Choi .................... H01L 21/486 |

* cited by examiner

DIELECTRIC SLOTS UNDERNEATH CONDUCTIVE VIAS IN INTERCONNECT STRUCTURE OF SEMICONDUCTOR PACKAGE AND METHOD OF FORMING THE SAME

PRIORITY CLAIM AND CROSS-REFERENCE

This application claims the benefit of U.S. Provisional Application No. 63/266,523, filed on Jan. 7, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
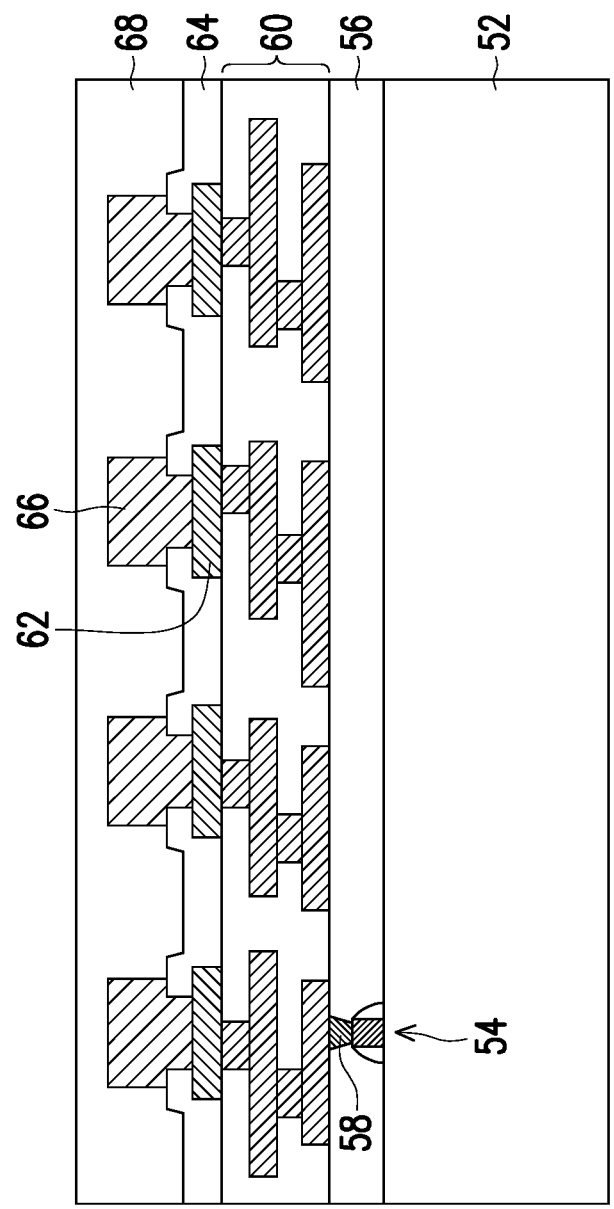
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a semiconductor package includes a back-side redistribution structure having multiple layers of metallization patterns. The back-side redistribution structure having multiple layers of metallization patterns may be advantageous for increasing routing ability, such as for routing between system-on-chips (SoCs) and DRAM packages attached to the back-side redistribution structure.

Some embodiments of the current disclosure decrease stress between layers of the back-side redistribution structure at positions underneath through vias. Embodiments may address stress arising from mismatches in respective coefficients of thermal expansion of through vias and adjacent encapsulant material. The embodiments may reduce stress under respective bases of the through vias in the back-side redistribution structure occurring during high temperature processes such as curing of encapsulant material or mounting and reflowing of solder ball connectors that lead to, e.g., greater expansion of the encapsulant material relative to expansion of the through vias. The embodiments decrease stress and disadvantageous delamination between metallization patterns and dielectric layers of the back-side redistribution structure. Including dielectric slots in a metallization pattern below respective footprints of the through vias can decrease the stress producing the delamination. The delamination may also be reduced by adjusting relative thicknesses of dielectric layers of the back-side redistribution structure or including an adhesion layer over a metallization pattern.

FIG. 1 illustrates a cross-sectional view of an integrated circuit die 50 in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front-side, and an inactive surface (e.g., the surface facing downwards in FIG. 1), sometimes called a back-side.

Devices (represented by a transistor) 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 50.

Optionally, solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing and are packaged, and dies, which fail the CP testing, are not packaged. After testing, the solder regions may be removed in subsequent processing steps.

A dielectric layer 68 may (or may not) be on the active side of the integrated circuit die 50, such as on the passivation films 64 and the die connectors 66. The dielectric layer 68 laterally encapsulates the die connectors 66, and the dielectric layer 68 is laterally coterminous with the integrated circuit die 50. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well. Alternatively, the solder regions may be removed prior to forming the dielectric layer 68.

The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

In some embodiments, the integrated circuit die 50 is a stacked device that includes multiple semiconductor substrates 52. For example, the integrated circuit die 50 may be a memory device such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 60.

FIGS. 2 through 19 illustrate cross-sectional and plan views of intermediate steps during a process for forming a first package component 100, in accordance with some embodiments. A first package region 100A and a second package region 100B are illustrated, and one or more of the integrated circuit dies 50 are packaged to form an integrated circuit package in each of the package regions 100A and 100B. The integrated circuit packages may also be referred to as integrated fan-out (InFO) packages.

Figure 2:
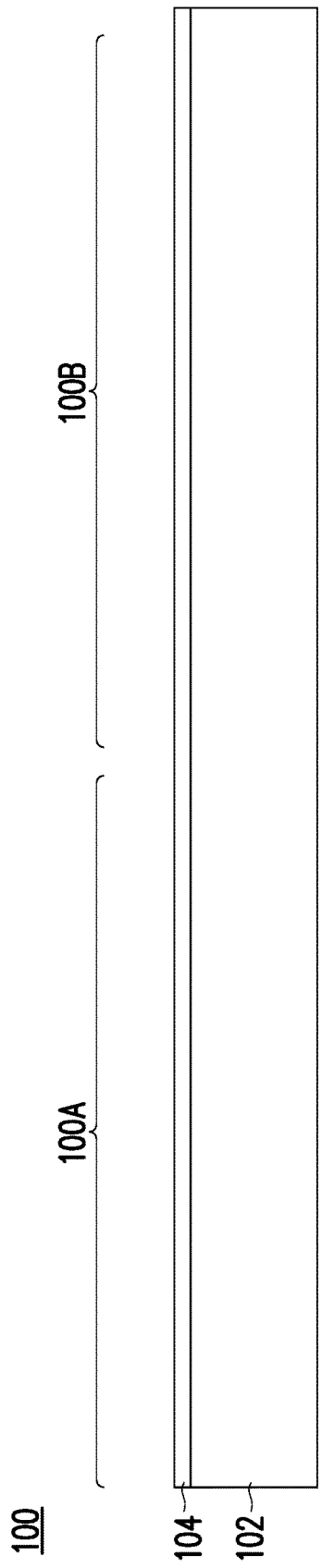
FIGS. 2, 3A-3E, 4A-4E, 5A, 5B, 6A, 6B, 7A-7D, 8A, 8B, 9A, 9B, and 10 through 19 illustrate cross-sectional and top-down views of intermediate steps during a process for forming a package component in accordance with some embodiments.

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

In FIGS. 3A through 6B, a back-side redistribution structure 106 is formed on the release layer 104. As discussed in greater detail below, the back-side redistribution structure 106 is formed and through vias are formed over the back-side redistribution structure. The back-side redistribution structure 106 may include one or more dielectric layers and metallization patterns (sometimes referred to as redistribution layers or redistribution lines) between adjacent ones of the dielectric layers. The back-side redistribution structure 106 includes dielectric slots in the metallization pattern below the footprints of one or more of the through vias. The dielectric slots may reduce the stress between various layers, such as between the layers of the metallization patterns and the dielectric layers of the back-side redistribution structure, thereby reducing delamination issues.

Figure 3A:
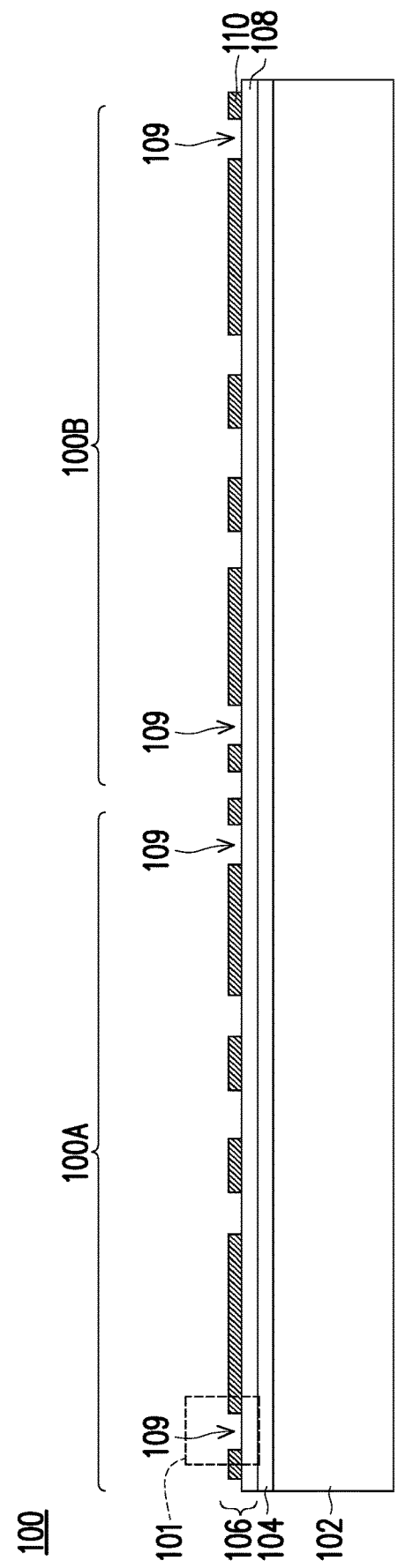
Figure 3B:
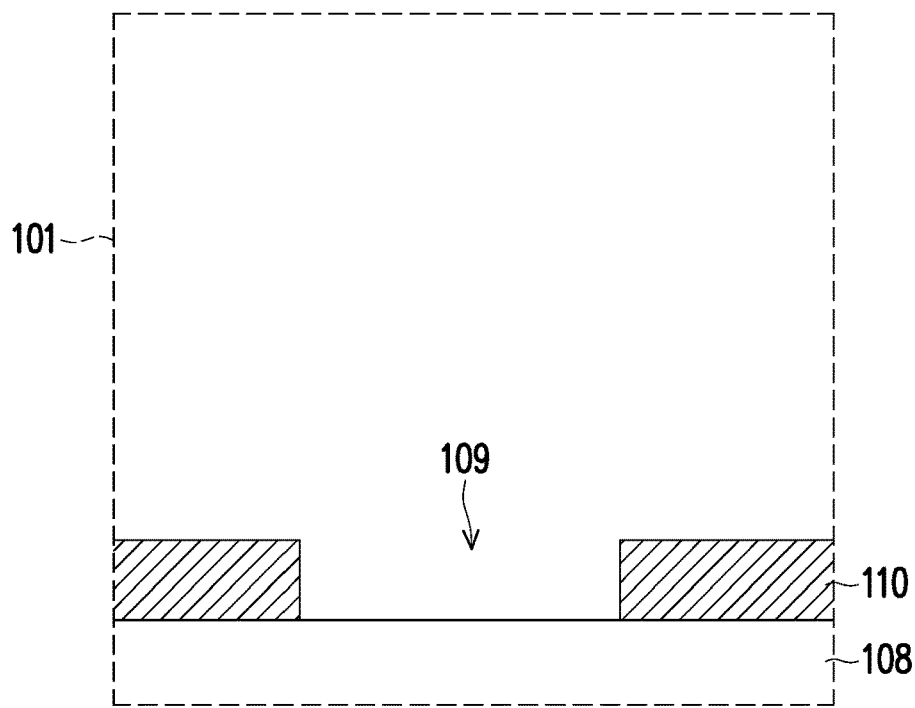
Figure 3C:
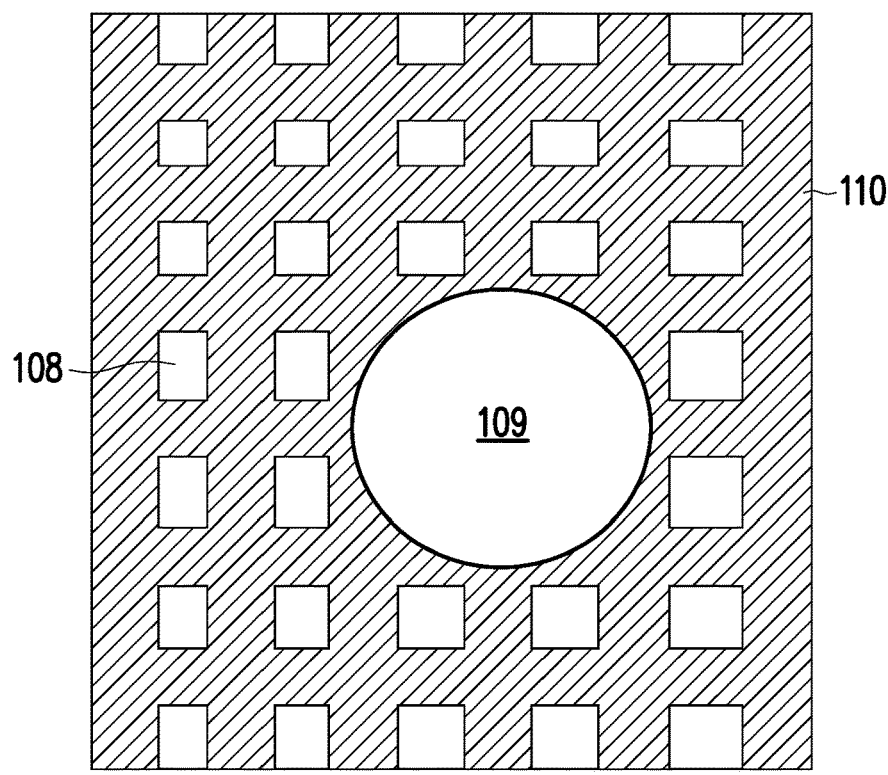
Figure 3D:
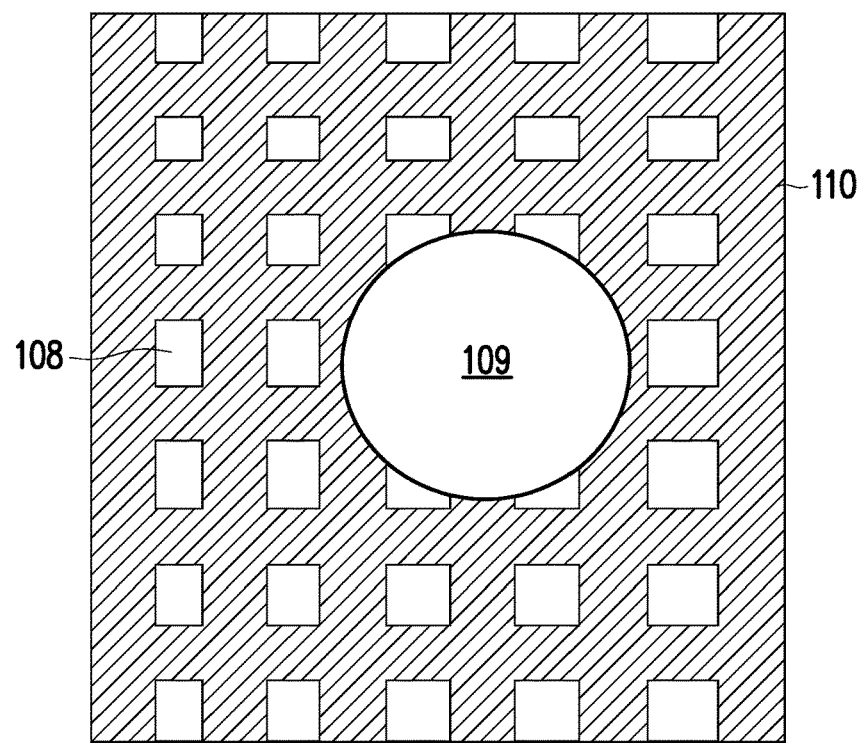
Figure 3E:
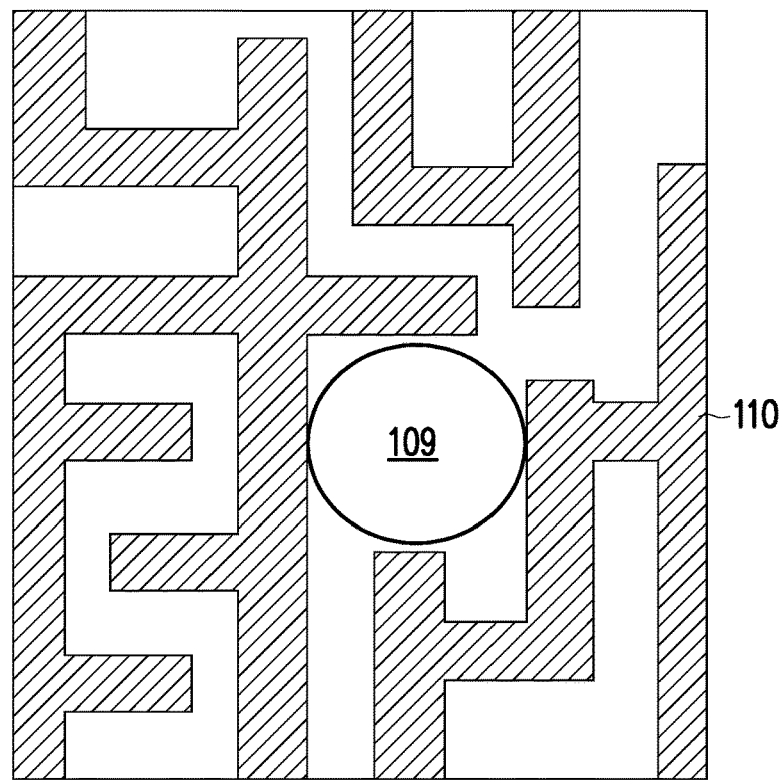

FIG. 3A illustrates the formation of the dielectric layer 108 and a metallization pattern 110 of the back-side redistribution structure 106. The metallization pattern 110 may include conductive redistribution lines used for routing and/or dummy patterns. As illustrated in FIG. 3A, the metallization pattern 110 is patterned to include regions 109 (which represents the region below subsequently formed through vias) that are free of conductive patterns (e.g., free of the conductive redistribution lines and/or the dummy patterns). FIG. 3B illustrates a detailed cross-sectional view of region 101 as illustrated in FIG. 3A. As discussed in greater detail below, a through via will be formed over the region 109 of the redistribution structure 106, and having region 109 free of conductive material below the through via may reduce stress. FIGS. 3C-3E illustrate plan views of embodiments of the structure at the level of the metallization pattern 110 in a region surrounding the region 109. Subsequent figures following from FIGS. 3C-3E will illustrate plan views at the same level.

As shown in FIG. 3A, the dielectric layer 108 may be formed over the release layer 104. The bottom surface of the dielectric layer 108 may be in contact with the top surface of the release layer 104. In some embodiments, the dielectric layer 108 is formed of a polymer, such as polybenzoxazole (PBO), polyimide, benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, CVD, laminating, the like, or a combination thereof.

The metallization pattern 110 may be formed on the dielectric layer 108. In some embodiments as illustrated in FIGS. 3C and 3D, the metallization pattern 110 includes a dummy pattern, such as a metal grid or mesh. For example, FIGS. 3C and 3D illustrate embodiments in which the metallization pattern 110 includes a dummy pattern having a shape similar to a first plurality of strips having lengthwise directions in the X-direction intersecting a second plurality of strips having lengthwise directions in the Y-direction, which may be (or may not be) perpendicular to the X-direction. The dummy pattern may be electrically isolated from active conductive lines and vias of the metallization pattern 110. Including the dummy pattern may be advantageous by increasing the density of metal in the back-side redistribution structure 106 and thereby reducing subsequent package warpage. Although the dummy pattern is illustrated as a continuous metal grid in FIGS. 3C and 3D, in some embodiments as the dummy pattern may be separated into multiple electrically isolated areas.

In some embodiments as illustrated in FIG. 3E, the region 109 is positioned amongst a pattern of active conductive lines of the metallization pattern 110, and the active conductive lines are arranged in a manner such that a region 109 is free of the metallization pattern 110.

As an example to form metallization pattern 110, a seed layer is formed over the dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist (not shown) is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

As illustrated by FIGS. 3B-3D, regions 109 expose the dielectric layer 108 through the metallization pattern 110. FIG. 3C illustrates a metallization pattern 110 having a dummy pattern (e.g., a metal grid pattern), wherein the dummy pattern omits conductive material in the region 109. The illustrated embodiment in FIG. 3C illustrates region 109 having a round shape in which the region 109 does not intersect smaller openings through the dummy pattern of the metallization pattern 110. FIG. 3D illustrates the region 109 with a round shape that intersects or overlaps smaller openings in the dummy pattern of the metallization pattern 110. The regions 109 are subsequently filled with dielectric material to form dielectric slots 111 (see below, FIGS. 4A-4D) underneath subsequently formed through vias 116. This may be advantageous by reducing delamination between the metallization pattern 110 and the subsequently formed dielectric layer 112. In some embodiments, the regions 109 have round shapes in a top view, as illustrated by FIGS. 3C and 3D. In some embodiments, the regions 109 have other shapes such as square shapes, hexagonal shapes, or octagonal shapes. However, any suitable shape may be used for the region 109.

In FIGS. 4A-4E, the dielectric layer 112 is formed on the metallization pattern 110 and the dielectric layer 108. In some embodiments, the dielectric layer 112 is formed of a polymer, which may be a photo-sensitive material such as PBO, polyimide, BCB, or the like, that may be patterned using a lithography mask. In other embodiments, the dielectric layer 112 is formed of a nitride such as silicon nitride; an oxide such as silicon oxide, PSG, BSG, BPSG; or the like. The dielectric layer 112 may be formed by spin coating, lamination, CVD, the like, or a combination thereof.

Figure 4A:
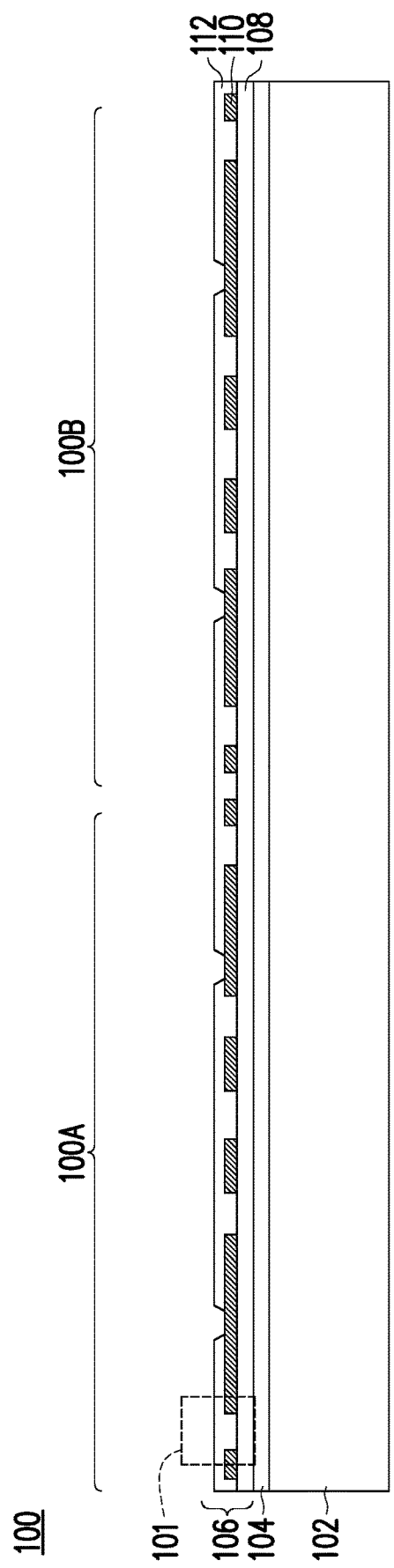
Figure 4B:
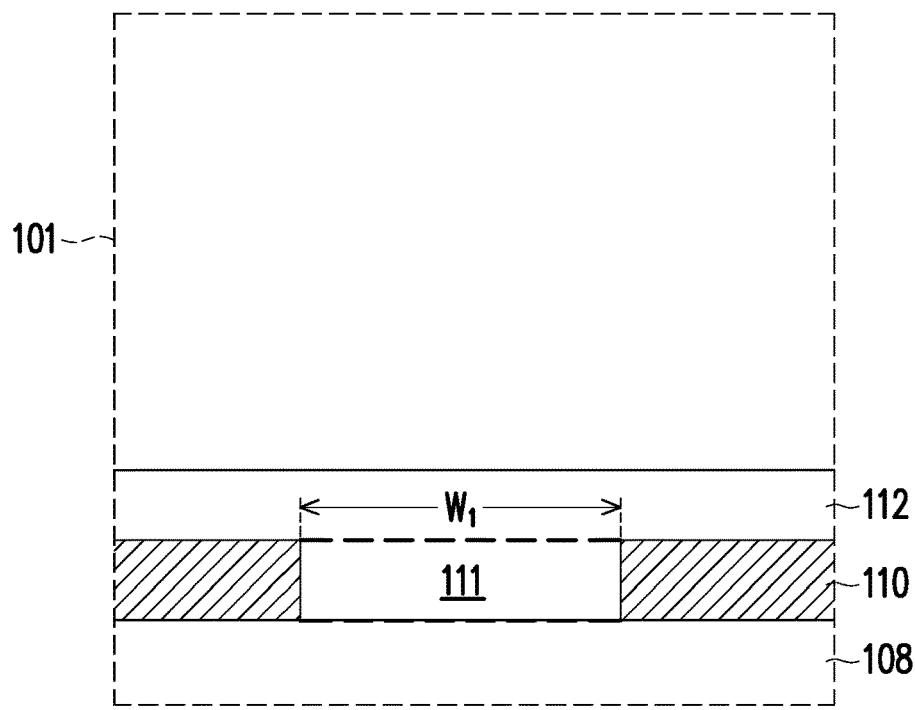
Figure 4C:
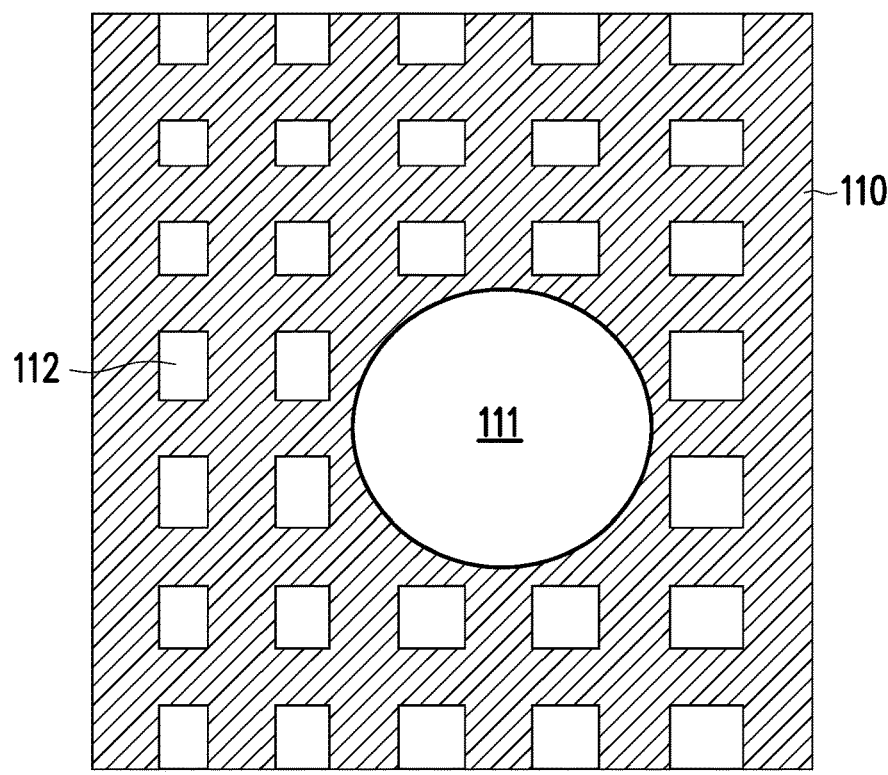
Figure 4D:
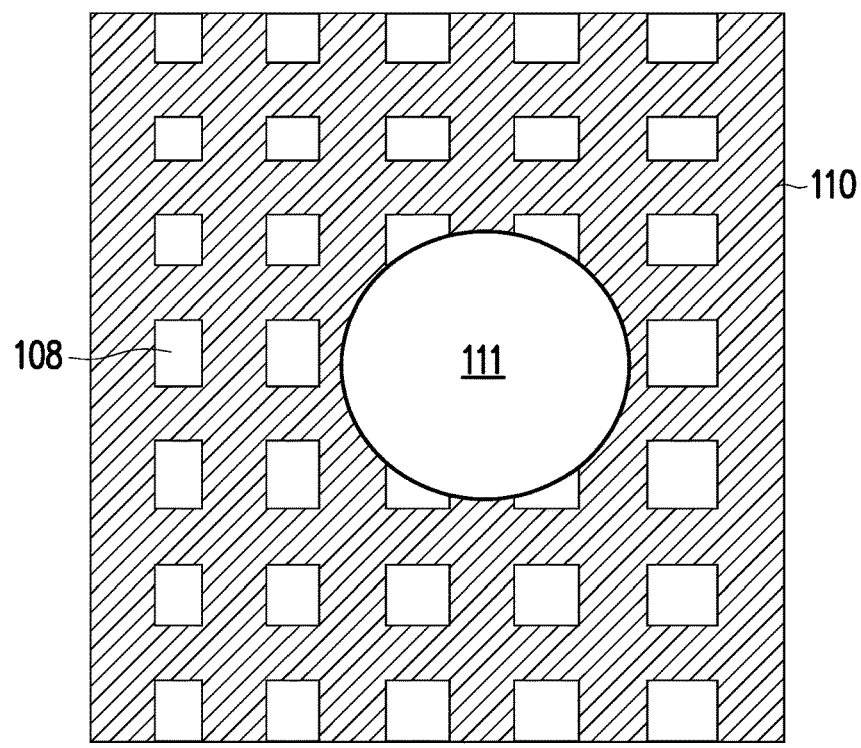
Figure 4E:
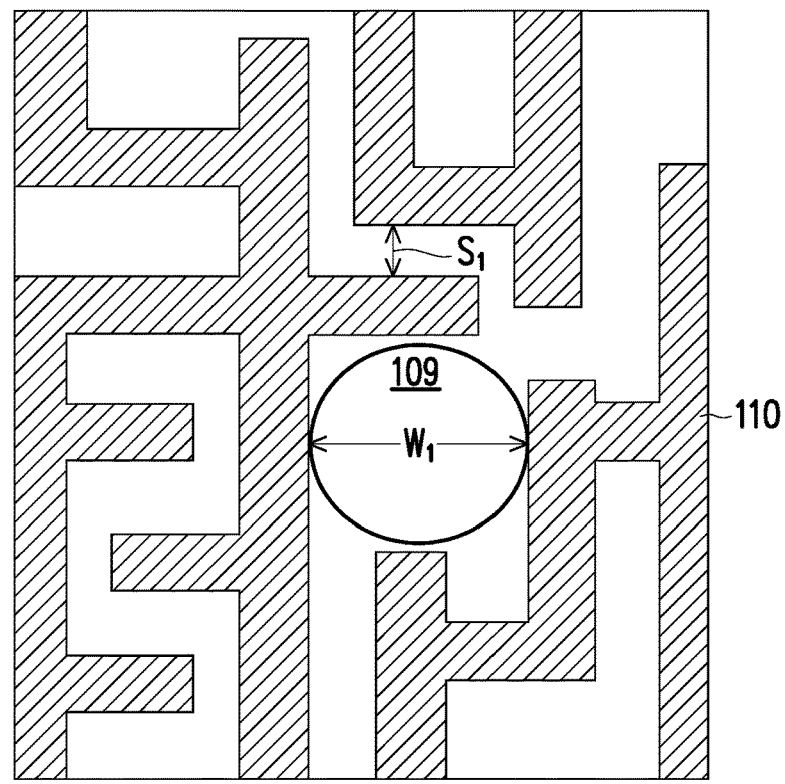

As illustrated by FIGS. 4B-4E, the dielectric layer 112 fills the region 109, forming dielectric slots 111 in the metallization pattern 110. Other openings through the metallization pattern 110 (e.g., square or rectangular openings in the dummy pattern, spaces between redistribution lines, etc.) are also filled with dielectric material of the dielectric layer 112. In some embodiments, the respective surface areas of the dielectric slots are larger than the respective surface areas of square or rectangular regions of the dummy pattern. The dielectric slots 111 are positioned under subsequently formed through vias 116, which may reduce delamination between the metallization pattern 110 and the dielectric layer 112. In some embodiments, the dielectric slots 111 are surrounded by conductive material of the metallization pattern 110 in a top view. In some embodiments, the dielectric slots 111 have respective first widths $W_1$ in a range of 55 μm to 65 μm, which is advantageous for reducing delamination between the metallization pattern 110 and the dielectric layer 112. Forming the dielectric slots 111 to widths less than 55 μm may not sufficiently reduce stress from mismatched thermal expansions of subsequently formed through vias 116 and encapsulant 120 (see below, FIG. 9A), leading to disadvantageous delamination between the metallization pattern 110 and the dielectric layer 112. Forming the dielectric slots 111 to widths greater than 65 μm may increase resistance in the metallization pattern 110, reducing device performance. As illustrated in FIG. 4E, in some embodiments the respective first widths $W_1$ are larger than first spaces $S_1$ between adjacent conductive lines of the metallization pattern 110.

In some embodiments, the dielectric slots 111 have round shapes in a plan view, as illustrated by FIGS. 4C-4E. In some embodiments, the dielectric slots 111 have other shapes such as square shapes, hexagonal shapes, or octagonal shapes. However, any suitable shape may be used for the dielectric slots 111.

Forming the dielectric slots 111 to reduce delamination between the metallization pattern 110 and the dielectric layer 112 may provide advantages. Forming the dielectric slots 111 may reduce the cost of the structure, as the dielectric layers of the back-side redistribution structure 106 (e.g., the dielectric layer 112) may not need to be thickened. As the dielectric layers of the back-side redistribution structure 106 are not thickened, the wafer-per-hour (WPH) rate of mass production may be increased. Reducing delamination between the metallization pattern 110 and the dielectric layer 112 by forming the dielectric slots 111 may lead to lower process warpage of the structure, giving better process yield loss control as well as better reliability performance and wider reliability window. In some embodiments, forming the dielectric slots 111 under the footprints of subsequently formed through vias 116 reduces stress between the metallization pattern 110 and the dielectric layer 112 by 18% to 30%.

Further referring to FIG. 4A, the dielectric layer 112 is then patterned to form openings exposing portions of the metallization pattern 110. The patterning may be formed by an acceptable process, such as by exposing the dielectric layer 112 to light when the dielectric layer 112 is a photo-sensitive material or by etching using, for example, an anisotropic etch. If the dielectric layer 112 is a photo-sensitive material, the dielectric layer 112 can be developed after the exposure.

Figure 5A:
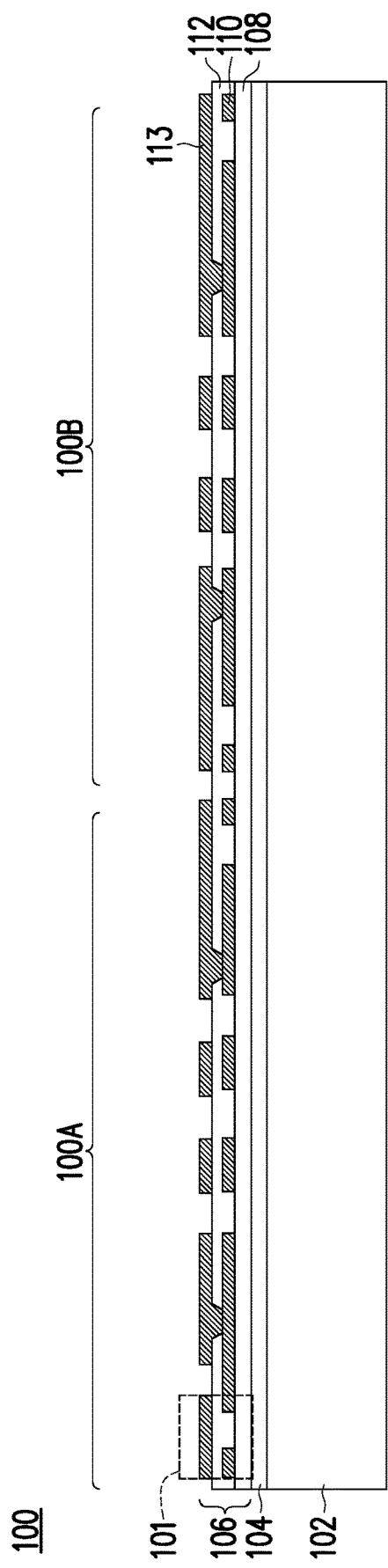
Figure 5B:
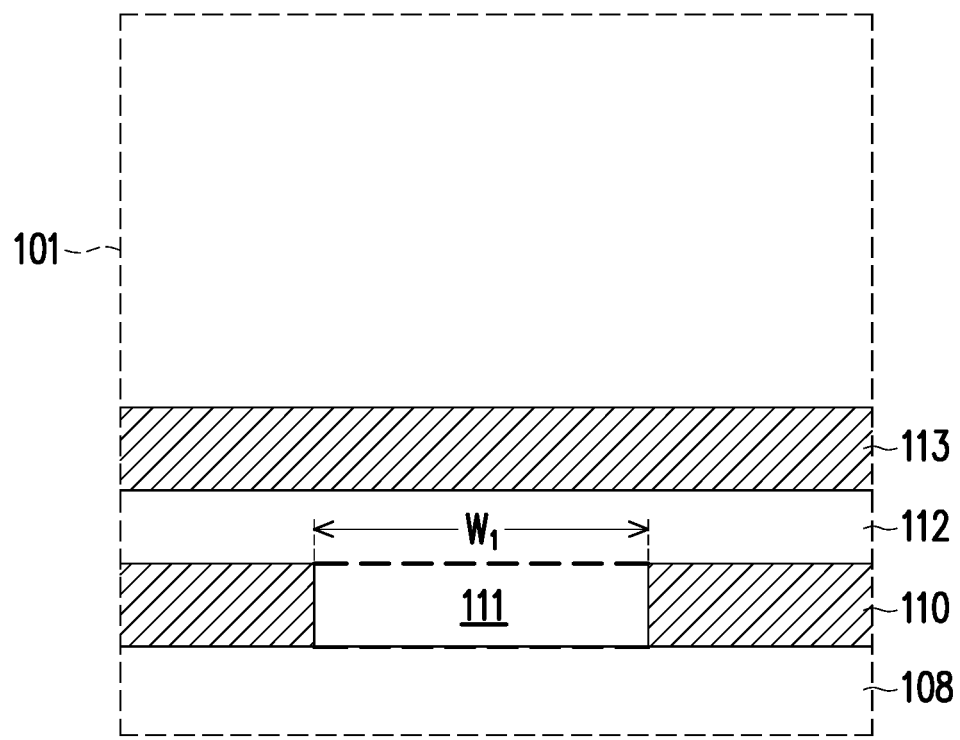

In FIGS. 5A-5B, the metallization pattern 113 is formed on the dielectric layer 112. The metallization pattern 113 includes portions on and extending along the major surface of the dielectric layer 112. The metallization pattern 113 further includes portions extending through the dielectric layer 112 to physically and electrically couple to the metallization pattern 110. The metallization pattern 113 may be formed in a similar manner and of a similar material as the metallization pattern 110. In some embodiments, the metallization pattern 113 has a different size than the metallization pattern 110. For example, the conductive lines and/or vias of the metallization pattern 113 may be wider or thicker than the conductive lines and/or vias of the metallization pattern 110. Further, the metallization pattern 113 may be formed to a greater pitch than the metallization pattern 110.

Figure 6A:
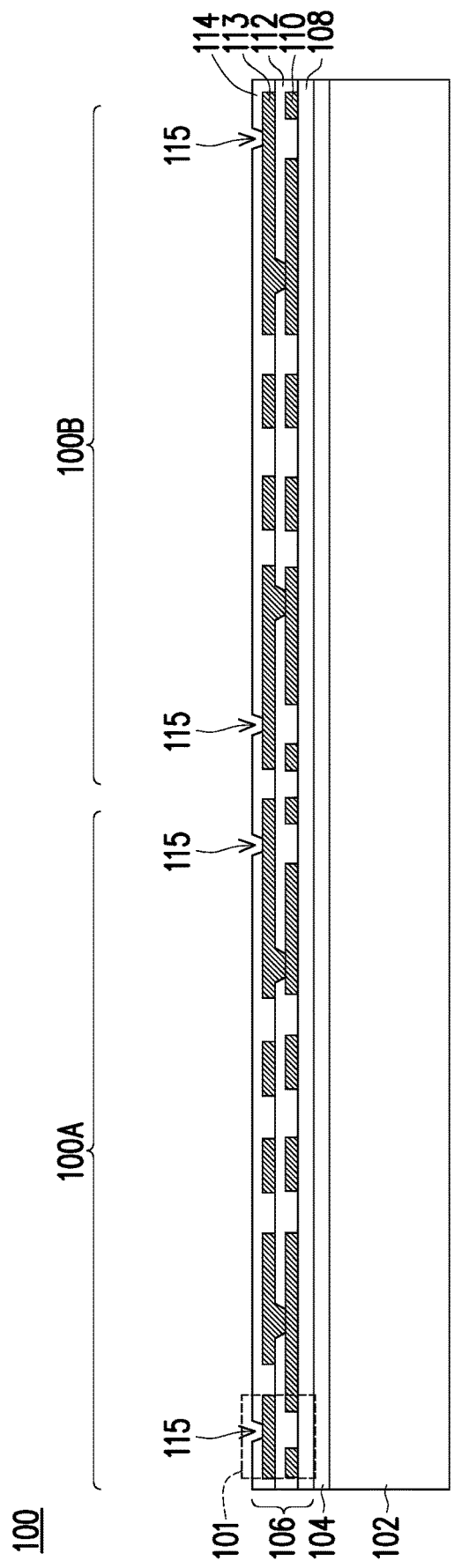
Figure 6B:
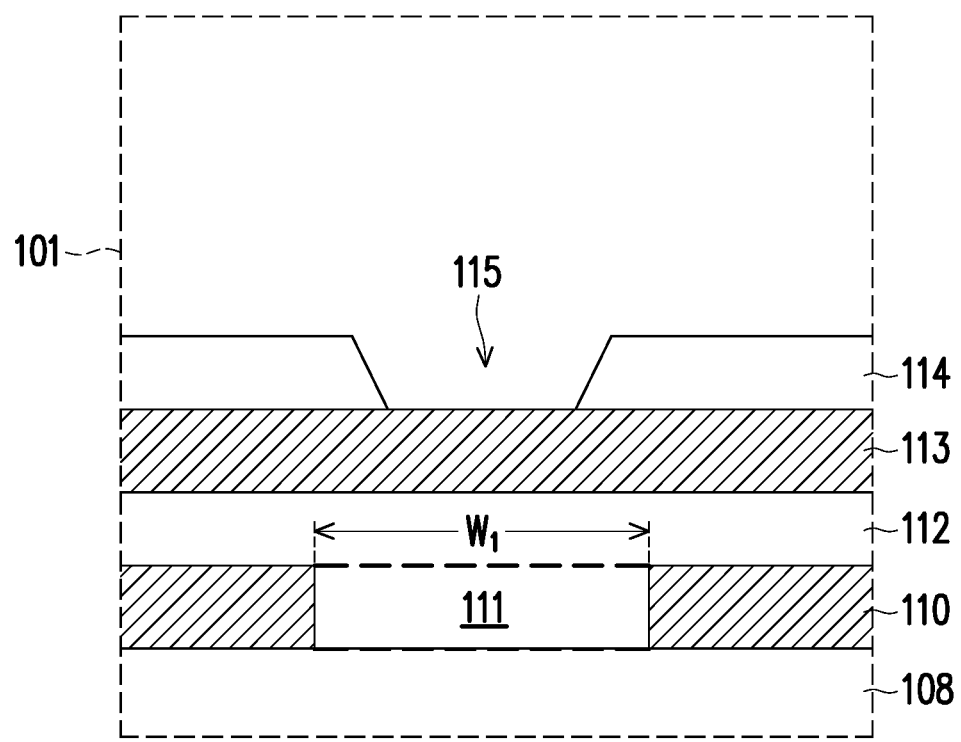

In FIGS. 6A-6B, the dielectric layer 114 is deposited on the metallization pattern 113 and the dielectric layer 112. The dielectric layer 114 may be formed in a manner similar to the dielectric layer 112, and may be formed of a similar material as the dielectric layer 112. The dielectric layer 114 is then patterned to form openings 115 exposing portions of the metallization pattern 113. The patterning may be formed by an acceptable process, such as by exposing the dielectric layer 114 to light when the dielectric layer 114 is a photo-sensitive material or by etching using, for example, an anisotropic etch. If the dielectric layer 114 is a photo-sensitive material, the dielectric layer 114 can be developed after the exposure. The openings 115 are subsequently filled with conductive material to form conductive vias 117 coupling the metallization pattern 113 to subsequently formed through vias 116 (see below, FIGS. 7A-7B).

FIG. 6A illustrates a back-side redistribution structure 106 having two metallization patterns 110 and 113 for illustrative purposes. In some embodiments, the back-side redistribution structure 106 may include any number of dielectric layers and metallization patterns. If more dielectric layers and metallization patterns are to be formed, steps and processes discussed above may be repeated. The metallization patterns may include one or more conductive elements. The conductive elements may be formed during the formation of the metallization pattern by forming the seed layer and conductive material of the metallization pattern over a surface of the underlying dielectric layer and in the opening of the underlying dielectric layer, thereby interconnecting and electrically coupling various conductive lines.

Figure 7A:
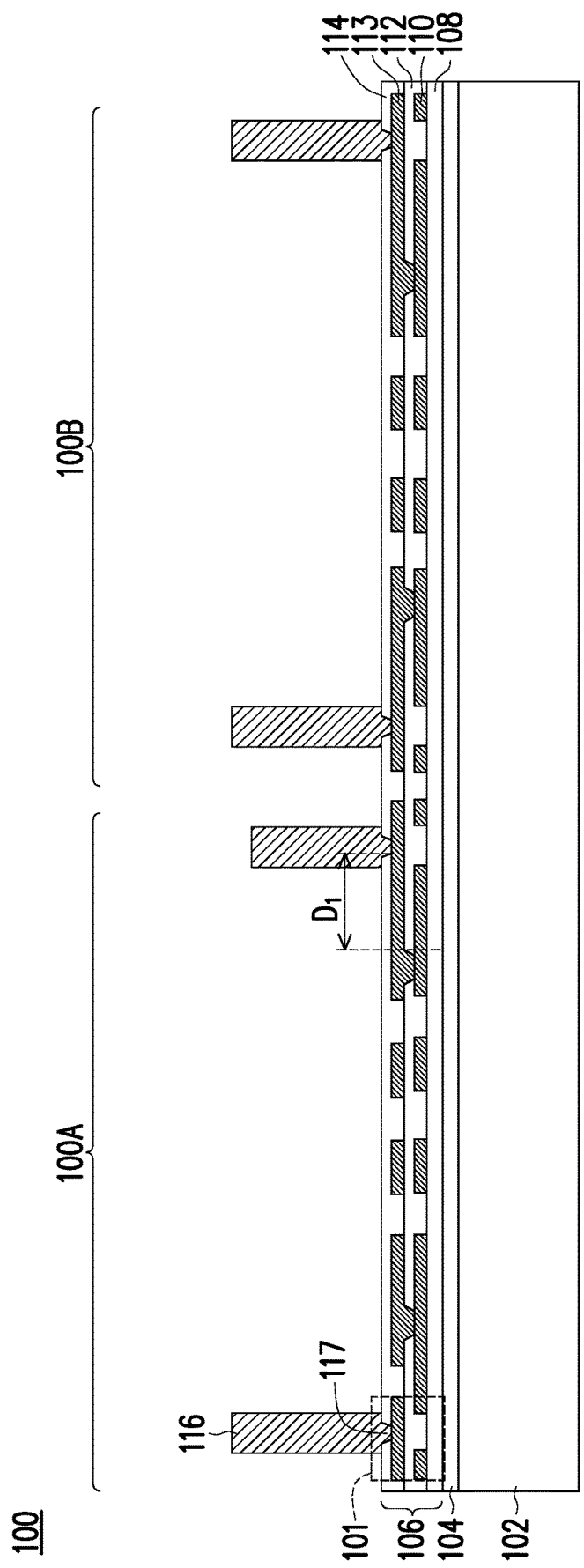
Figure 7B:
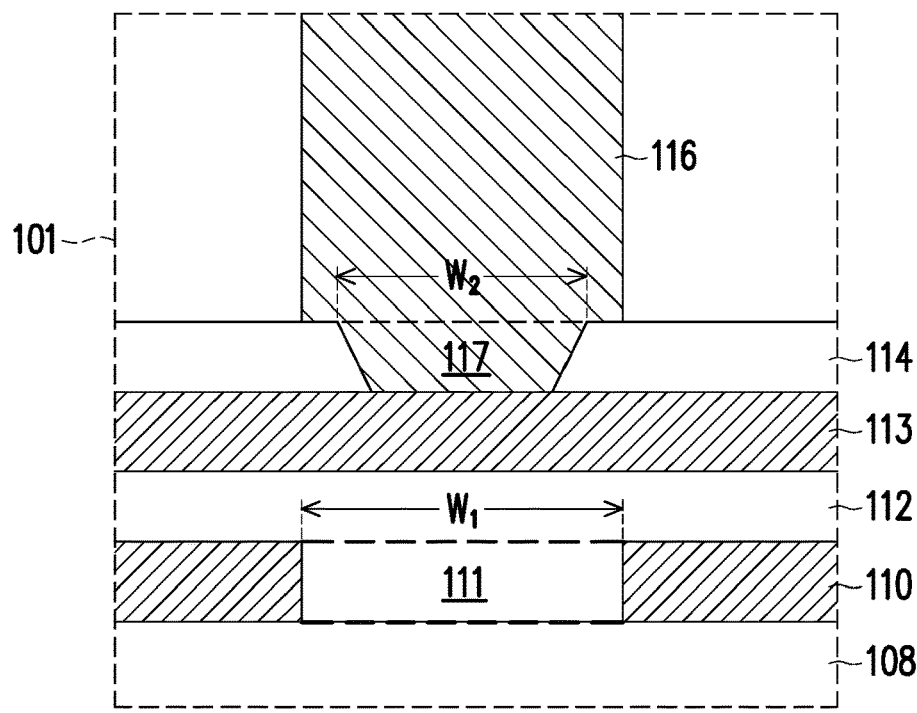

In FIGS. 7A-7B, through vias 116 are formed in the openings 115 and extending away from the topmost dielectric layer of the back-side redistribution structure 106 (e.g., the dielectric layer 112). The through vias 116 include vias 117 that are below upper surfaces of the dielectric layer 114. The vias 117 and through vias 116 are formed overlying the dielectric slots 111. As an example to form the through vias 116, a seed layer (not shown) is formed over the back-side redistribution structure 106, e.g., on the dielectric layer 112 and portions of the metallization pattern 110 exposed by the openings 115. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 116, with portions below upper surfaces of the dielectric layer 114 being vias 117 extending through the dielectric layer 114 to the uppermost metallization layer, such as metallization pattern 113.

In some embodiments, the through vias 116 have widths in a range of 150 µm to 200 µm, and adjacent through vias 116 are separated from each other by spaces in a range of 120 µm to 150 µm. The widths of the through vias 116 may be greater than the respective first widths $W_1$ of the dielectric slots 111 underneath the through vias 116. For example, the respective first widths $W_1$ may be 33% to 43% of the widths of the through vias 116. In some embodiments, the vias 117 are laterally separated from conductive vias of lower metallization patterns. For example, FIG. 7A illustrates that the via 117 the through via 116 is laterally separated from the via of the metallization pattern 113 that extends to physically and electrically contact the metallization pattern 110 by a distance $D_1$, such as in a range of 17 µm to 18 µm.

The vias 117 are formed to have respective second widths $W_2$ smaller than respective first widths $W_1$ of the dielectric slots 111 beneath the vias 117. This is advantageous by reducing stress from mismatched thermal expansions of the through vias 116 and subsequently formed encapsulant 120 (see below, FIG. 9A), which may prevent or reduce delamination between the metallization pattern 110 and the dielectric layer 112. In some embodiments, the second widths $W_2$ are in a range of 40 µm to 50 µm.

Figure 7C:
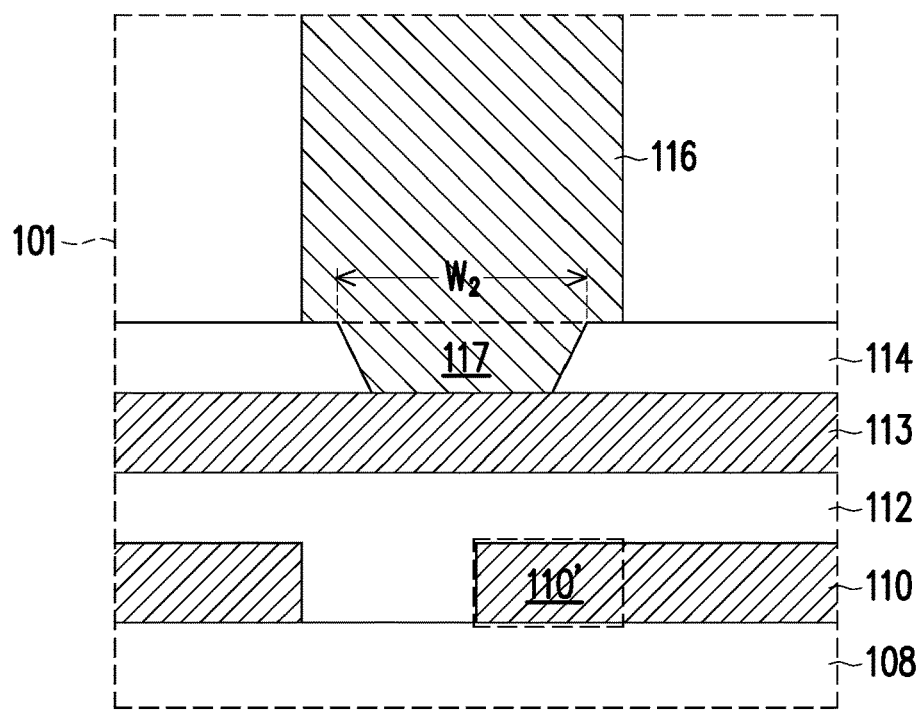
Figure 7D:
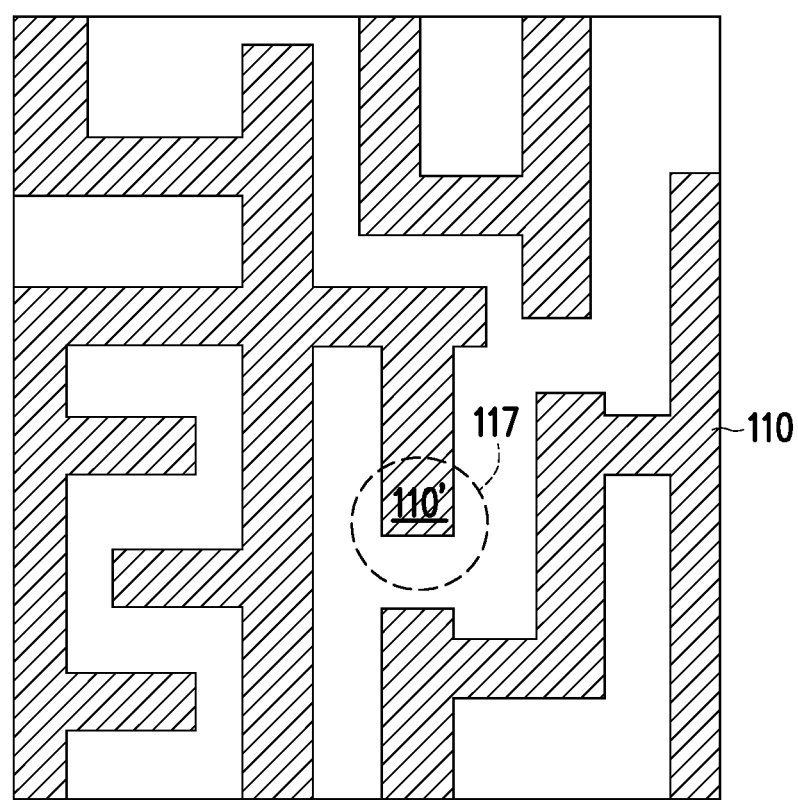

In some embodiments, a portion 110' of the metallization pattern 110 (e.g., a portion of a dummy pattern, a portion of a redistribution line, or the like) extends under the footprint of the via 117. For example, FIG. 7C illustrates a side view showing portion 110' of the metallization pattern 110 within a footprint of a via 117 at the level of the metallization pattern 110, and FIG. 7D illustrates a plan view showing the portion 110' of the metallization pattern 110 within the footprint of the via 117 at the level of the metallization pattern 110, in accordance with some embodiments. A total amount of an upper surface area of the portion 110', which may include conductive material of redistribution lines, dummy patterns, or the like, has an upper surface area less than 20% of a surface area of the via 117. This is advantageous for preventing or reducing delamination between the metallization pattern 110 and the dielectric layer 112. A portion 110' of conductive material with an upper surface area 65% or greater of a surface area of the via 117 being present under the respective footprint of the via 117 at the level of the metallization pattern 110 may be disadvantageous by leading to delamination between the metallization pattern 110 and the dielectric layer 112. In some embodiments, a total upper surface area of the portion 110' is less than 1500 µm².

Figure 8A:
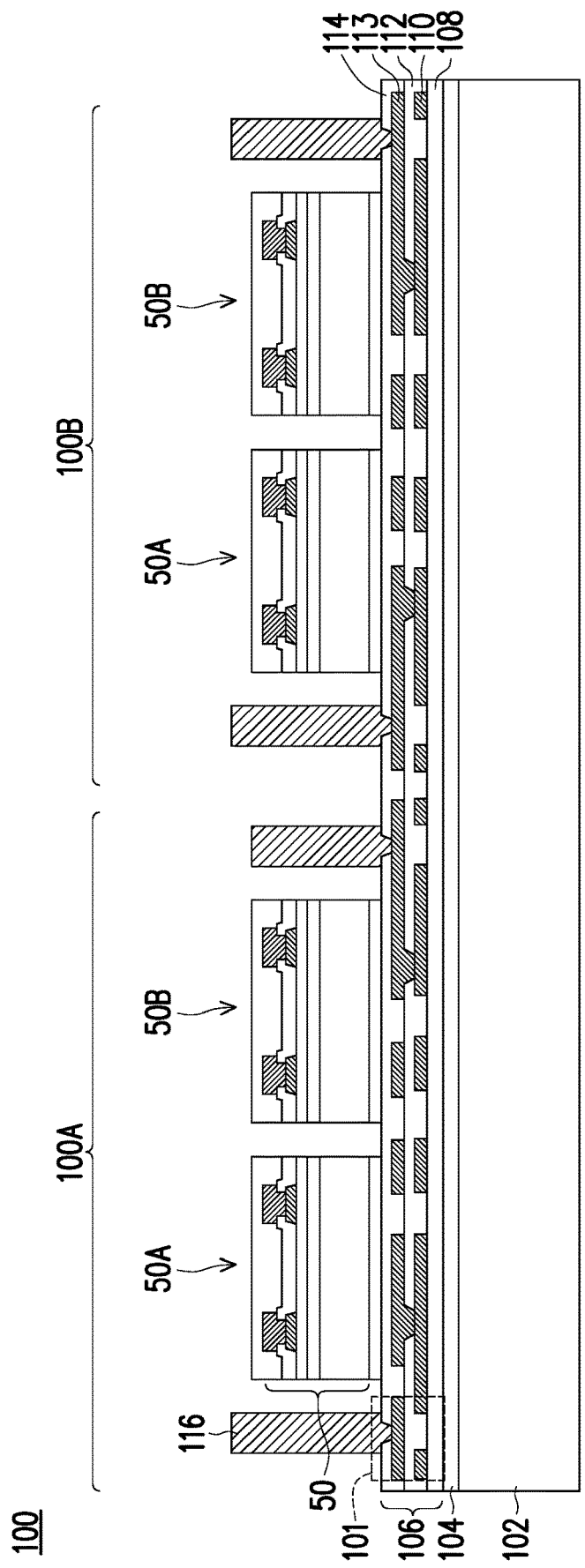
Figure 8B:
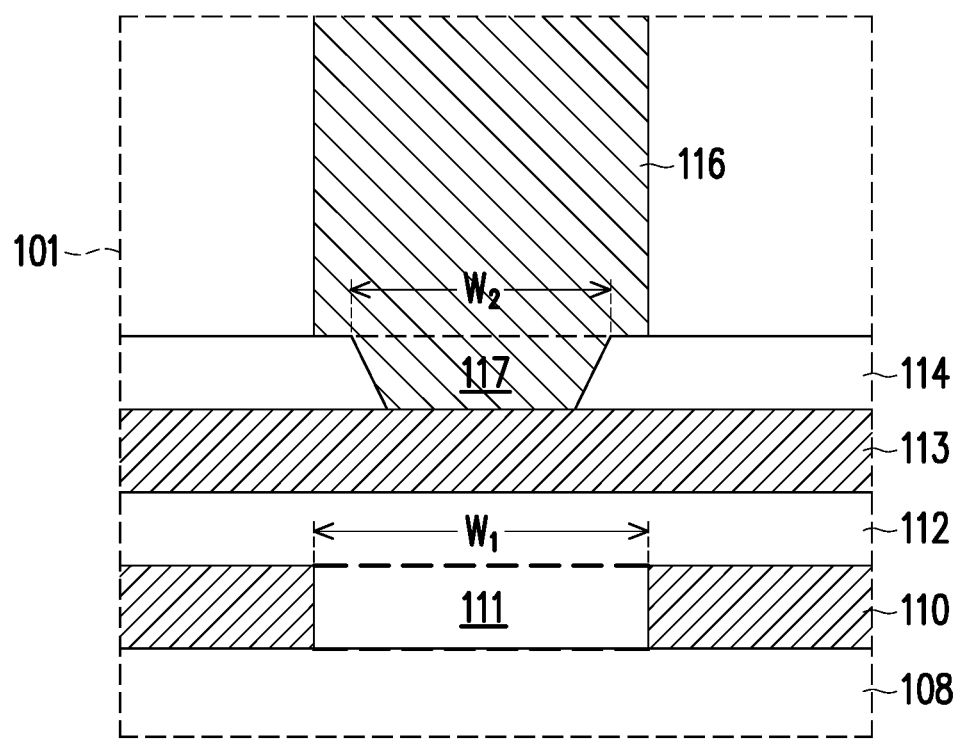

In FIGS. 8A-8B, integrated circuit dies 50 (e.g., a first integrated circuit die 50A and a second integrated circuit die 50B) are adhered to the dielectric layer 112 by an adhesive 118. A desired type and quantity of integrated circuit dies 50 are adhered in each of the package regions 100A and 100B. In the embodiment shown, multiple integrated circuit dies 50 are adhered adjacent one another, including the first integrated circuit die 50A and the second integrated circuit die 50B in each of the first package region 100A and the second package region 100B. The first integrated circuit die 50A may be a logic device, such as a central processing unit (CPU), a graphics processing unit (GPU), a system-on-a-chip (SoC), a microcontroller, or the like. The second integrated circuit die 50B may be a memory device, such as a dynamic random access memory (DRAM) die, a static random access memory (SRAM) die, a hybrid memory cube (HMC) module, a high bandwidth memory (HBM) module, or the like. In some embodiments, the integrated circuit dies 50A and 50B may be the same type of dies, such as SoC dies. The first integrated circuit die 50A and second integrated circuit die 50B may be formed in processes of a same technology node, or may be formed in processes of different technology nodes. For example, the first integrated circuit die 50A may be of a more advanced process node than the second integrated circuit die 50B. The integrated circuit dies 50A and 50B may have different sizes (e.g., different heights and/or surface areas), or may have the same size (e.g., same heights and/or surface areas). The space available for the through vias 116 in the first package region 100A and the second package region 100B may be limited, particularly when the integrated circuit dies 50 include devices with a large footprint, such as SoCs. Use of the back-side redistribution structure 106 allows for an improved interconnect arrangement when the first package region 100A and the second package region 100B have limited space available for the through vias 116.

The adhesive 118 is on back-sides of the integrated circuit dies 50 and adheres the integrated circuit dies 50 to the back-side redistribution structure 106, such as to the dielectric layer 112. The adhesive 118 may be any suitable adhesive, epoxy, die attach film (DAF), or the like. The adhesive 118 may be applied to back-sides of the integrated circuit dies 50, may be applied over the surface of the carrier substrate 102 if no back-side redistribution structure 106 is utilized, or may be applied to an upper surface of the back-side redistribution structure 106 if applicable. For example, the adhesive 118 may be applied to the back-sides of the integrated circuit dies 50 before singulating to separate the integrated circuit dies 50.

Figure 9A:
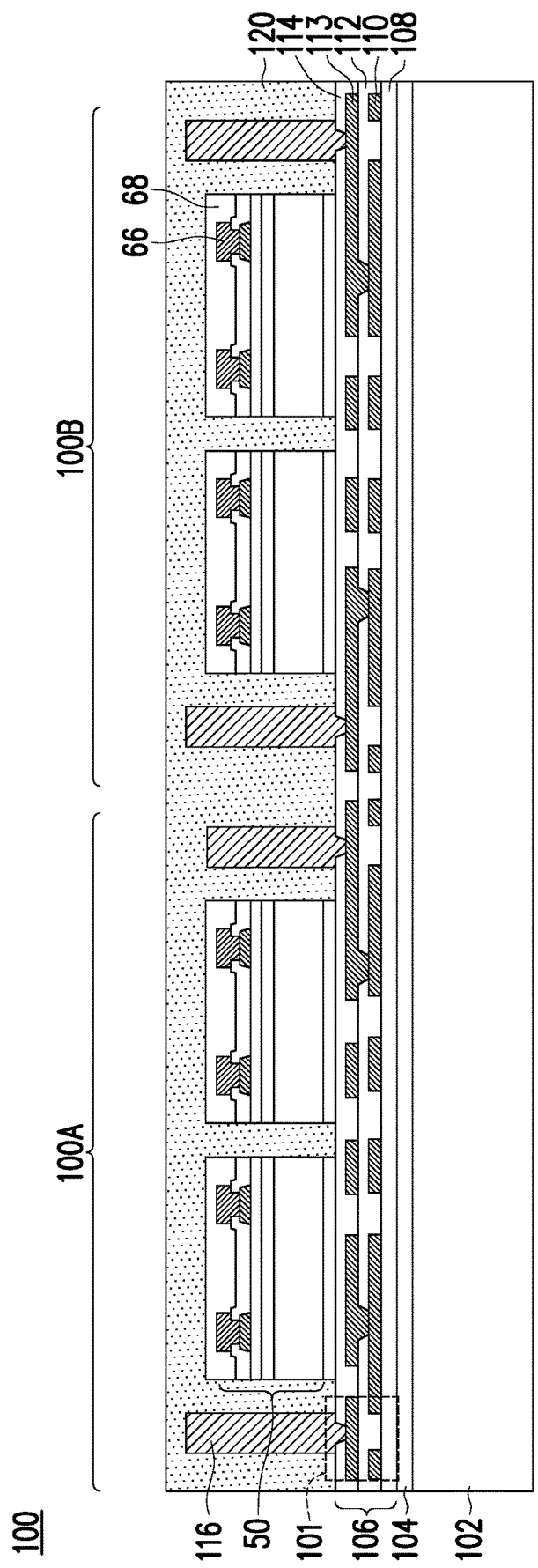
Figure 9B:
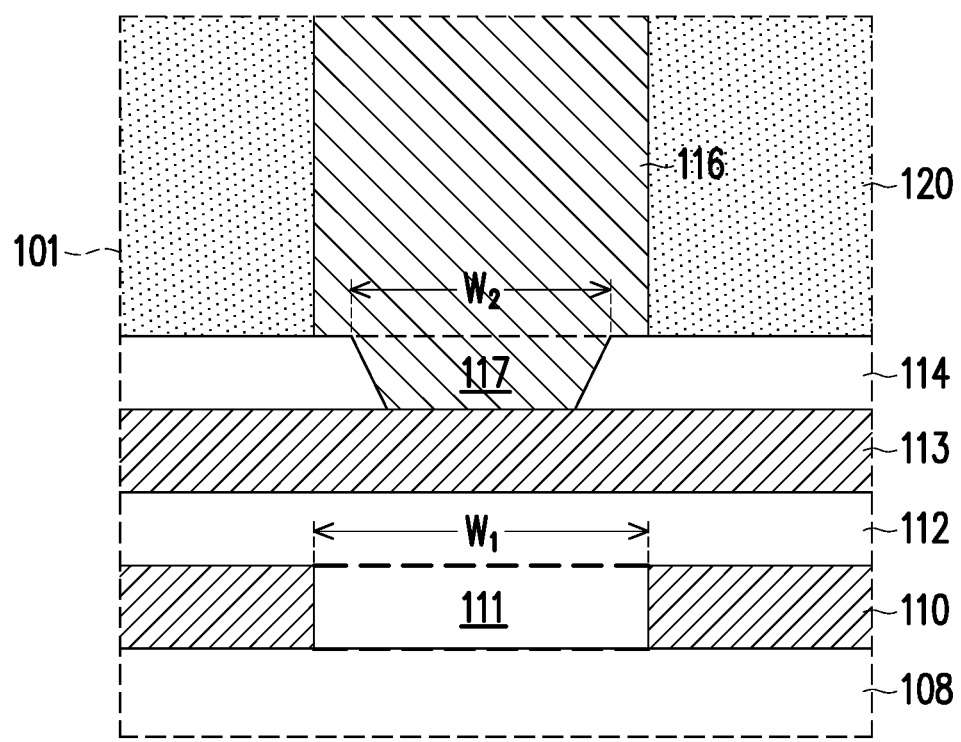

In FIGS. 9A-9B, an encapsulant 120 is formed on and around the various components. After formation, the encapsulant 120 encapsulates the through vias 116 and integrated circuit dies 50. The encapsulant 120 may be a molding compound, epoxy, or the like. The encapsulant 120 may be applied by compression molding, transfer molding, or the like, and may be formed over the carrier substrate 102 such that the through vias 116 and/or the integrated circuit dies 50 are buried or covered. The encapsulant 120 is further formed in gap regions between the integrated circuit dies 50. The encapsulant 120 may be applied in liquid or semi-liquid form and then subsequently cured.

The curing of the encapsulant 120 may be a high temperature process and may lead to greater expansion of the encapsulant 129 relative to expansion of the through vias 116, producing increased stress under respective bases of the through vias 116 in the back-side redistribution structure 106. The inclusion of dielectric slots 111 in the metallization pattern 110 under the respective footprints of the through vias 116 such as described herein may prevent or reduce delamination between, e.g., the metallization pattern 110 and the dielectric layer 112.

Figure 10:
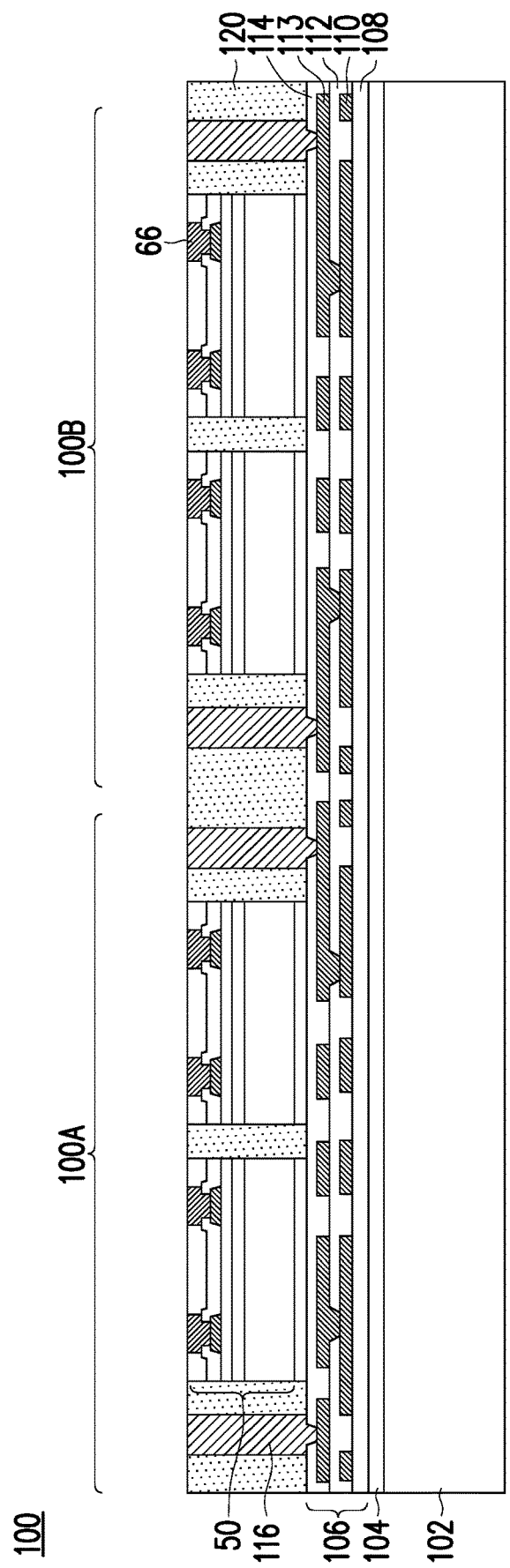

In FIG. 10, a planarization process is performed on the encapsulant 120 to expose the through vias 116 and the die connectors 66. The planarization process may also remove material of the through vias 116, dielectric layer 68, and/or die connectors 66 until the die connectors 66 and through vias 116 are exposed. Top surfaces of the through vias 116, die connectors 66, dielectric layer 68, and encapsulant 120 are substantially coplanar after the planarization process within process variations. The planarization process may be, for example, a chemical-mechanical polish (CMP), a grinding process, or the like. In some embodiments, the planarization may be omitted, for example, if the through vias 116 and/or die connectors 66 are already exposed.

In FIGS. 11 through 14, a front-side redistribution structure 122 is formed over the encapsulant 120, through vias 116, and integrated circuit dies 50. The front-side redistribution structure 122 may include one or more dielectric layers and metallization patterns (sometimes referred to as redistribution layers or redistribution lines) between adjacent ones of the dielectric layers.

Figure 11:
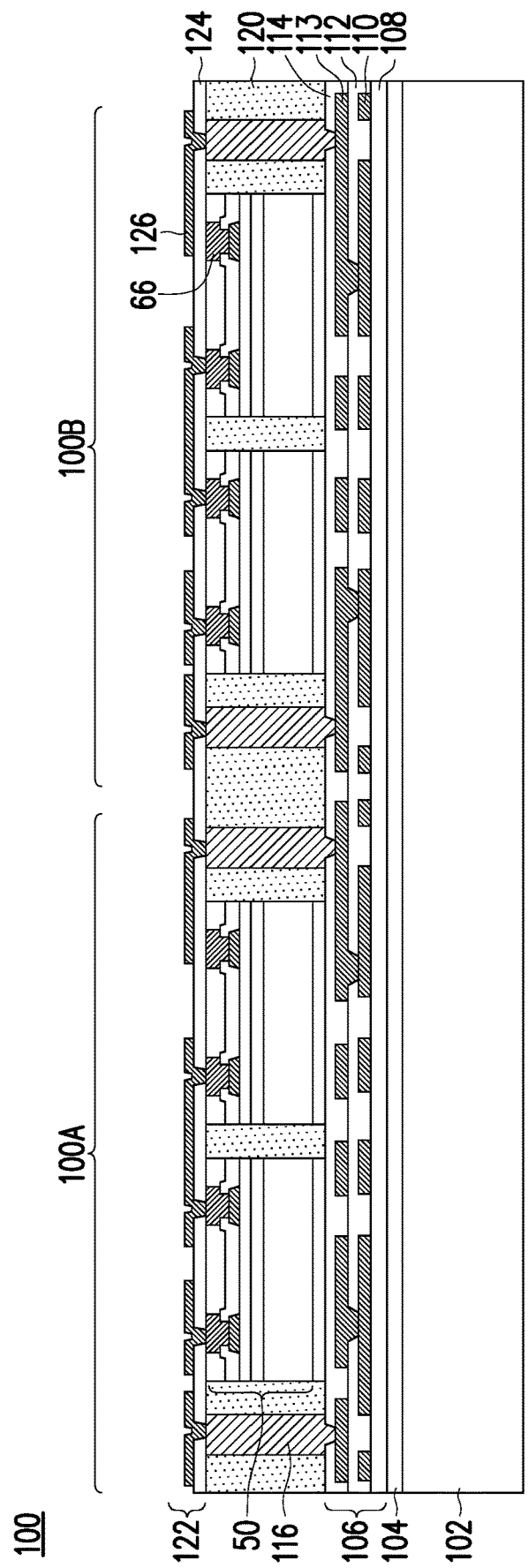

In FIG. 11, the dielectric layer 124 is deposited on the encapsulant 120, through vias 116, and die connectors 66. In some embodiments, the dielectric layer 124 is formed of a photo-sensitive material such as PBO, polyimide, BCB, or the like, which may be patterned using a lithography mask. The dielectric layer 124 may be formed by spin coating, lamination, CVD, the like, or a combination thereof. The dielectric layer 124 is then patterned. The patterning forms openings exposing portions of the through vias 116 and the die connectors 66. The patterning may be by an acceptable process, such as by exposing and developing the dielectric layer 124 to light when the dielectric layer 124 is a photo-sensitive material or by etching using, for example, an anisotropic etch.

The metallization pattern 126 is then formed. The metallization pattern 126 includes conductive elements extending along the major surface of the dielectric layer 124 and extending through the dielectric layer 124 to physically and electrically couple to the through vias 116 and the integrated circuit dies 50. As an example to form the metallization pattern 126, a seed layer is formed over the dielectric layer 124 and in the openings extending through the dielectric layer 124. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 126. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 126. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 12:
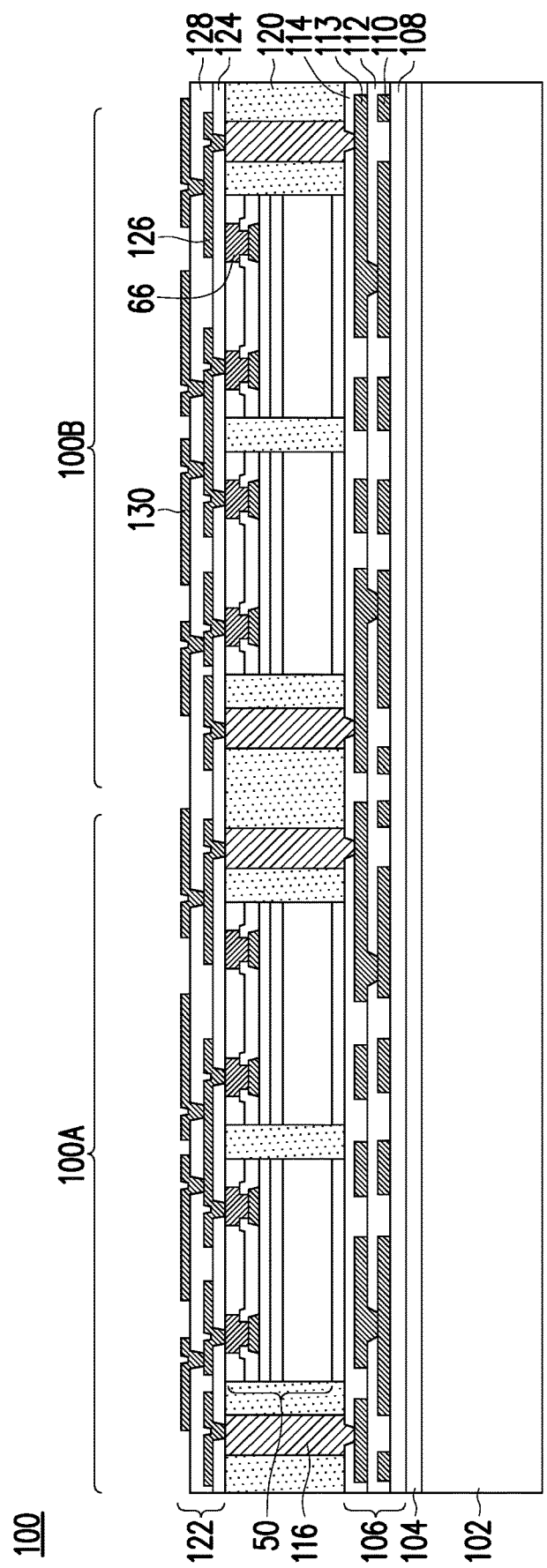

In FIG. 12, the dielectric layer 128 is deposited on the metallization pattern 126 and the dielectric layer 124. The dielectric layer 128 may be formed in a manner similar to the dielectric layer 124, and may be formed of a similar material as the dielectric layer 124.

The metallization pattern 130 is then formed. The metallization pattern 130 includes portions on and extending along the major surface of the dielectric layer 128. The metallization pattern 130 further includes portions extending through the dielectric layer 128 to physically and electrically couple the metallization pattern 126. The metallization pattern 130 may be formed in a similar manner and of a similar material as the metallization pattern 126. In some embodiments, the metallization pattern 130 has a different size than the metallization pattern 126. For example, the conductive lines and/or vias of the metallization pattern 130 may be wider or thicker than the conductive lines and/or vias of the metallization pattern 126. Further, the metallization pattern 130 may be formed to a greater pitch than the metallization pattern 126.

Figure 13:
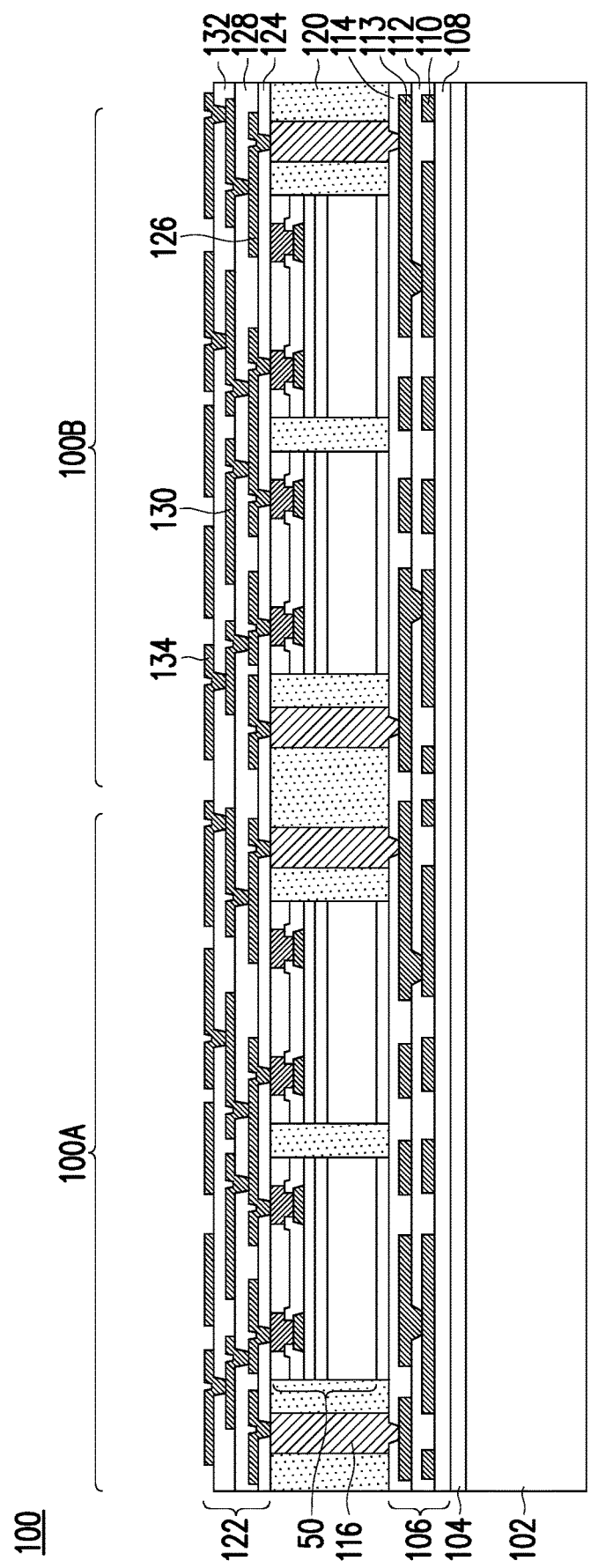

In FIG. 13, the dielectric layer 132 is deposited on the metallization pattern 130 and the dielectric layer 128. The dielectric layer 132 may be formed in a manner similar to the dielectric layer 124, and may be formed of a similar material as the dielectric layer 124.

The metallization pattern 134 is then formed. The metallization pattern 134 includes portions on and extending along the major surface of the dielectric layer 132. The metallization pattern 134 further includes portions extending through the dielectric layer 132 to physically and electrically couple the metallization pattern 130. The metallization pattern 134 may be formed in a similar manner and of a similar material as the metallization pattern 126. The metallization pattern 134 is the topmost metallization pattern of the front-side redistribution structure 122. As such, all of the intermediate metallization patterns of the front-side redistribution structure 122 (e.g., the metallization patterns 126 and 130) are disposed between the metallization pattern 134 and the integrated circuit dies 50. In some embodiments, the metallization pattern 134 has a different size than the metallization patterns 126 and 130. For example, the conductive lines and/or vias of the metallization pattern 134 may be wider or thicker than the conductive lines and/or vias of the metallization patterns 126 and 130. Further, the metallization pattern 134 may be formed to a greater pitch than the metallization pattern 130.

Figure 14:
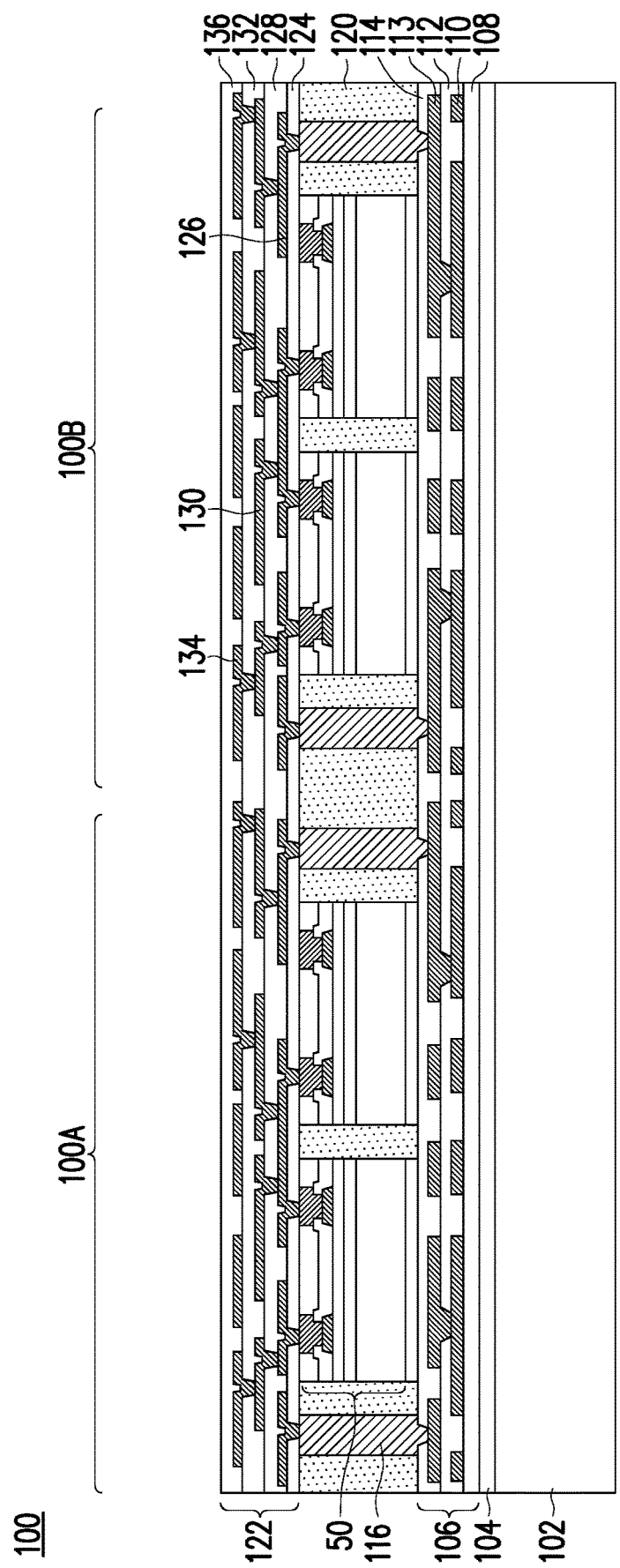

In FIG. 14, the dielectric layer 136 is deposited on the metallization pattern 134 and the dielectric layer 132. The dielectric layer 136 may be formed in a manner similar to the dielectric layer 124, and may be formed of the same material as the dielectric layer 124. The dielectric layer 136 is the topmost dielectric layer of the front-side redistribution structure 122. As such, all of the metallization patterns of the front-side redistribution structure 122 (e.g., the metallization patterns 126, 130, and 134) are disposed between the dielectric layer 136 and the integrated circuit dies 50.

Further, all of the intermediate dielectric layers of the front-side redistribution structure 122 (e.g., the dielectric layers 124, 128, 132) are disposed between the dielectric layer 136 and the integrated circuit dies 50.

The front-side redistribution structure 122 is shown as an example having three layers of metallization patterns. More or fewer dielectric layers and metallization patterns may be formed in the front-side redistribution structure 122. If fewer dielectric layers and metallization patterns are to be formed, steps and process discussed above may be omitted. If more dielectric layers and metallization patterns are to be formed (e.g., four dielectric layers and five metallization patterns), steps and processes discussed above may be repeated.

Figure 15:
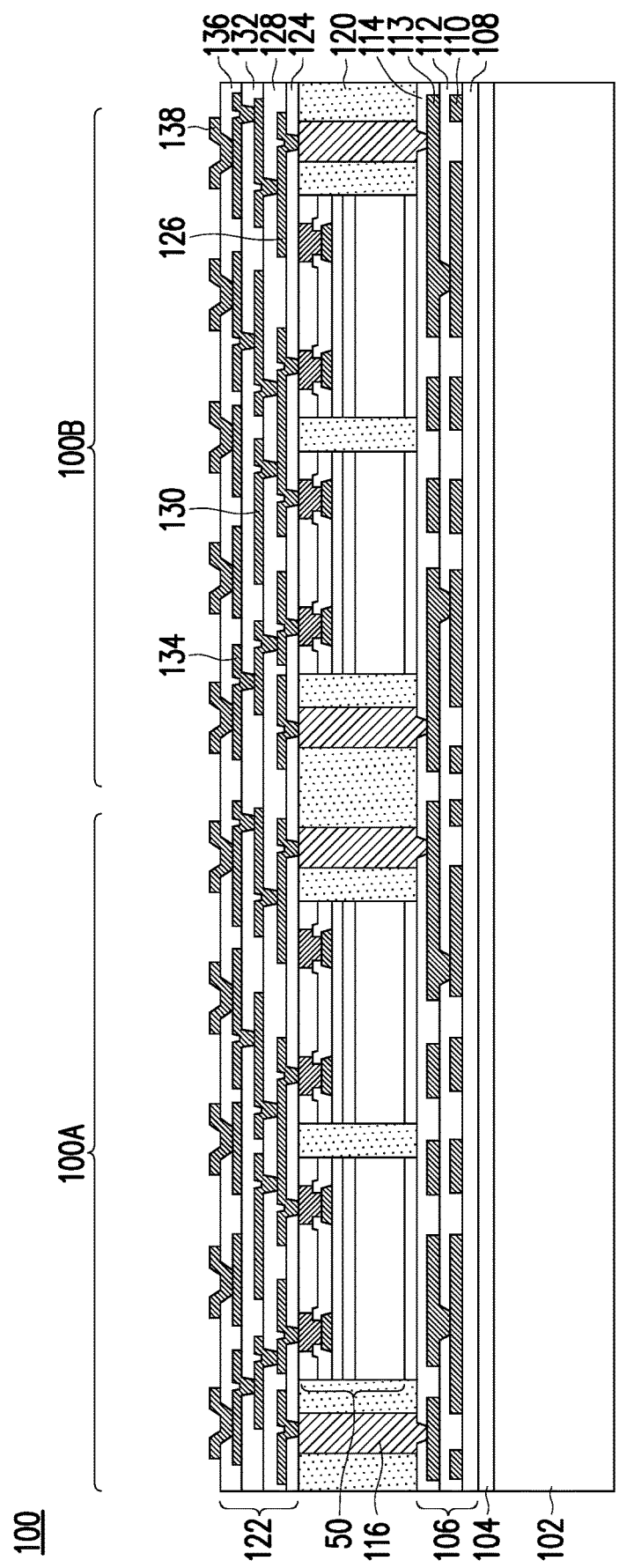

In FIG. 15, UBMs 138 are formed for external connection to the front-side redistribution structure 122. In some embodiments, the UBMs 138 have respective concave upper surfaces with upper portions on and extending along the major surface of the dielectric layer 136, and have lower portions extending through the dielectric layer 136 to physically and electrically couple the metallization pattern 134. In some embodiments, the UBMs 138 have flat or convex upper surfaces on and extending along the major surface of the dielectric layer 136. As a result, the UBMs 138 are electrically coupled to the through vias 116 and the integrated circuit dies 50. The UBMs 138 may be formed of the same material as the metallization pattern 126. In some embodiments, the UBMs 138 have a different size than the metallization patterns 126, 130, and 134.

Figure 16:
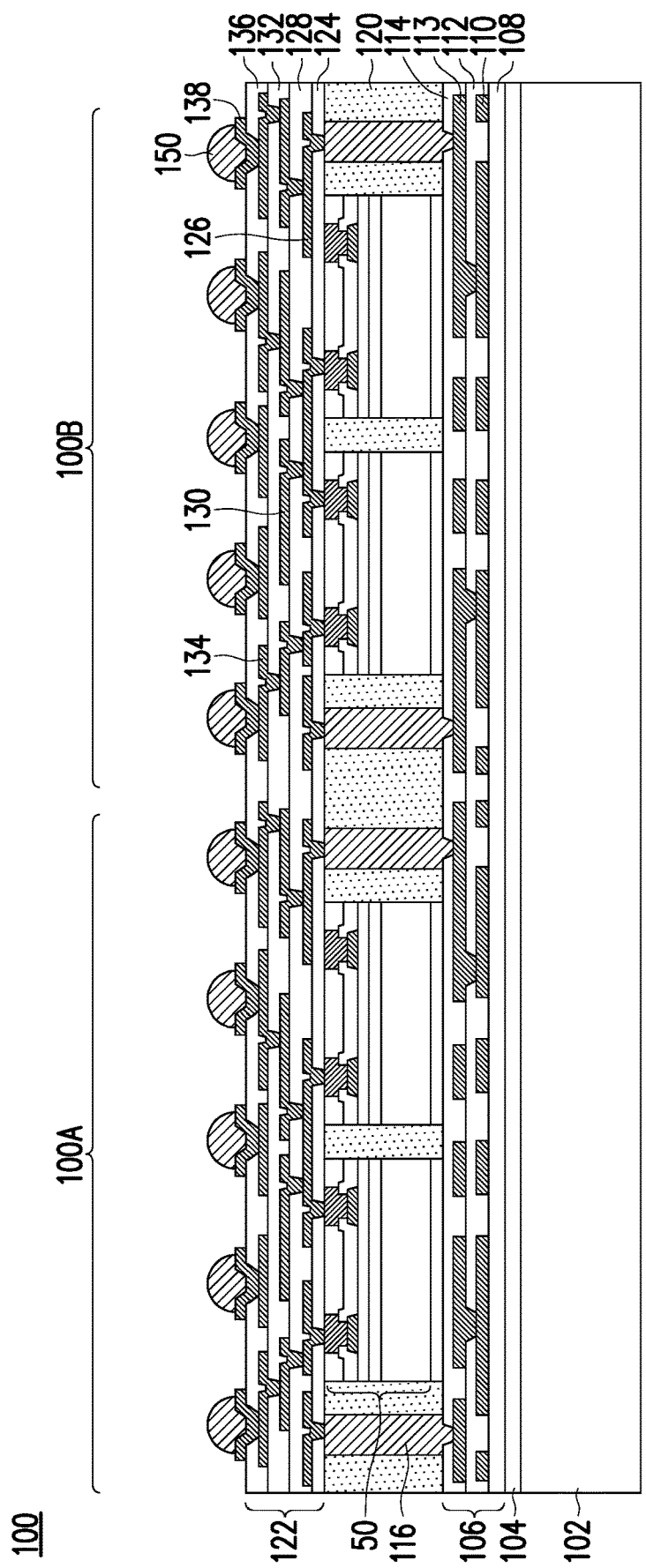

In FIG. 16, conductive connectors 150 are formed on the UBMs 138. The conductive connectors 150 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 150 may include a conductive material such as solder, copper, aluminum, gold, nickel, silver, palladium, tin, the like, or a combination thereof. In some embodiments, the conductive connectors 150 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 150 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 17:
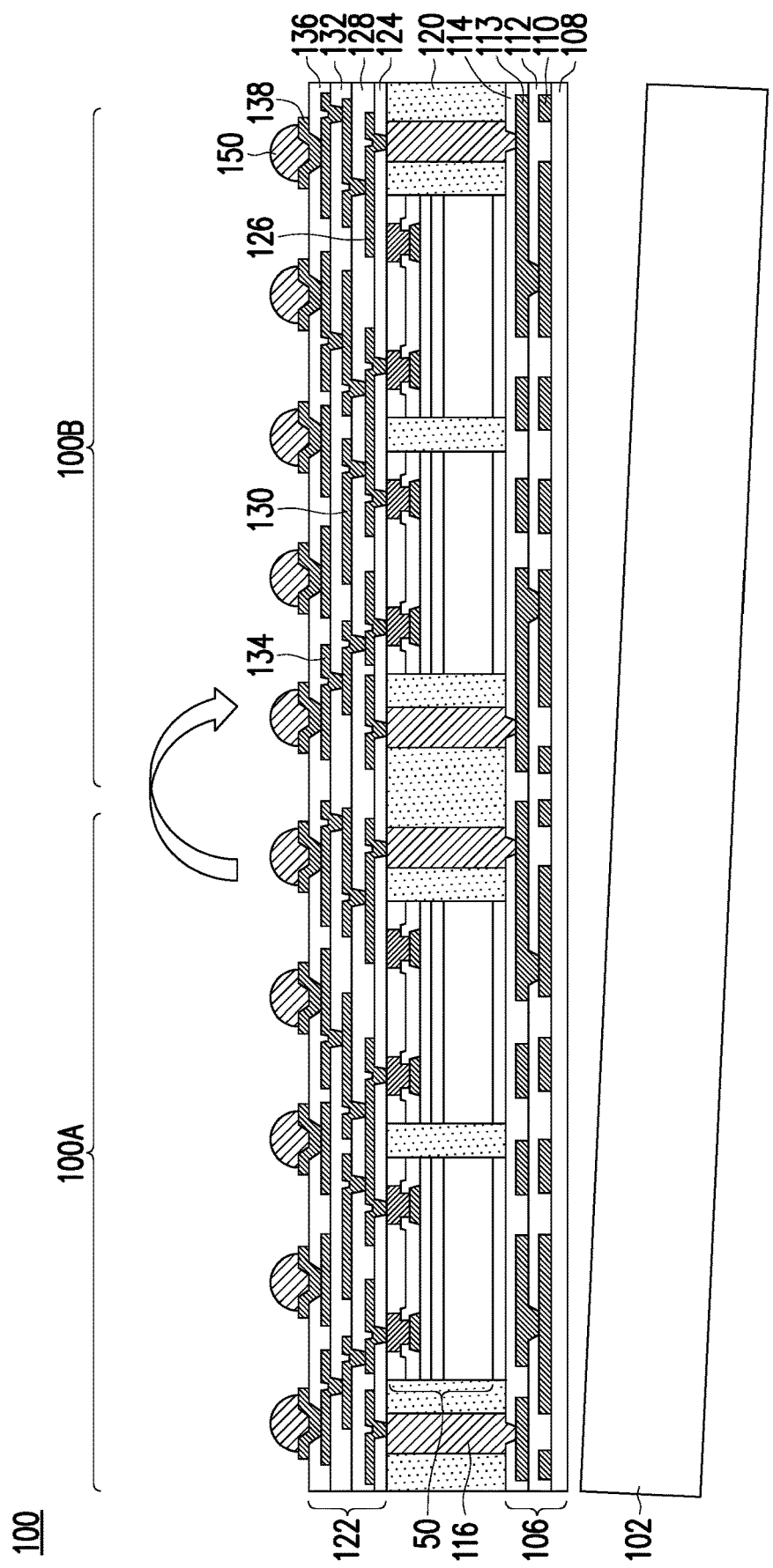
Figure 18:
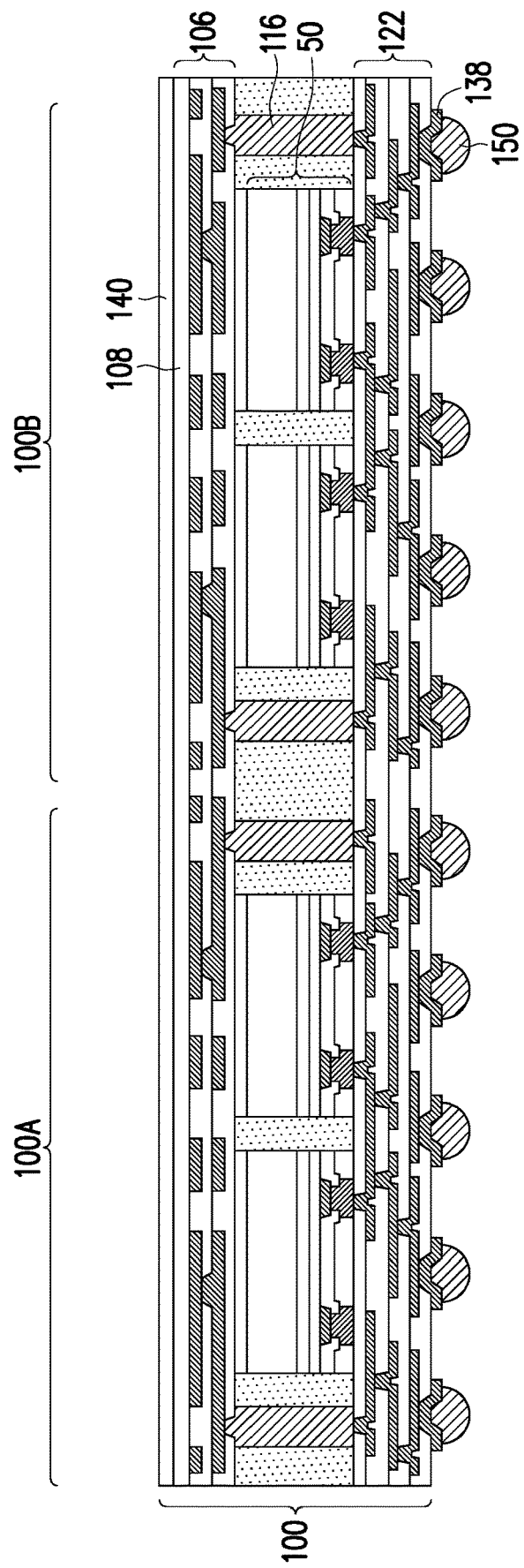

In FIG. 17, a carrier substrate de-bonding is performed to detach (or "de-bond") the carrier substrate 102 from the back-side redistribution structure 106, e.g., the dielectric layer 108. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape (not shown).

In some embodiments, a back-side enhancement layer 140 is formed over the back-side redistribution structure 106 to reduce or prevent package warping. The back-side enhancement layer 140 may be a polymer such as PBO, polyimide, BCB, or the like; a nitride such as silicon nitride or the like; an oxide such as silicon oxide, PSG, BSG, BPSG, or the like; the like, or a combination thereof. The back-side enhancement layer 140 may be formed, for example, by spin coating, lamination, chemical vapor deposition (CVD), or the like.

Figure 19:
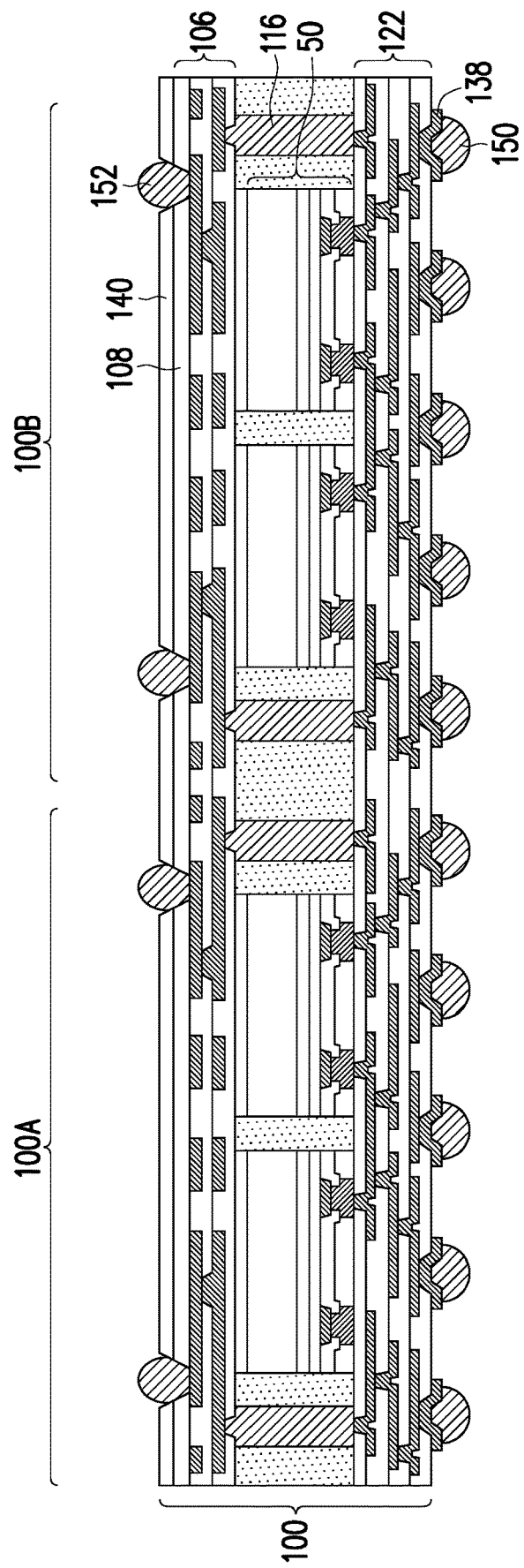

In FIG. 19, conductive connectors 152 are formed extending through the back-side enhancement layer 140 (if present) and the dielectric layer 108 to contact the metallization pattern 110. Openings are formed through the back-side enhancement layer 140 (if present) and the dielectric layer 108 to expose portions of the metallization pattern 110. The openings may be formed, for example, using laser drilling, etching, or the like. Exposed portions of the seed layer (if present, see above, FIG. 3A) may be removed during the formation of the openings. Following the formation of the openings, a surface clean process may be used to remove residue and byproducts resulting from the laser drilling, etching, or the like. A surface cleaning chemical, mixture, or solution may be used such as HF, HCl, $H_2SO_4$:$H_2O$ (Sulfuric acid-hydrogen Peroxide Mixture (SPM)), $NH_4OH$:$H_2O_2$:$H_2O$ (Ammonia hydroxide-hydrogen Peroxide-water Mixture (APM)), HCl:$H_2O_2$:$H_2O$ (Hydrochloric acid-hydrogen Peroxide-water Mixture (HPM)), the like, or combinations thereof, respectively.

The conductive connectors 152 are formed in the openings. In some embodiments, the conductive connectors 152 comprise flux and are formed in a flux dipping process. In some embodiments, the conductive connectors 152 comprise a conductive paste such as solder paste, silver paste, or the like, and are dispensed in a printing process. In some embodiments, the conductive connectors 152 are formed in a manner similar to the conductive connectors 150, and may be formed of a similar material as the conductive connectors 150.

In some embodiments, the conductive connectors 152 extend above the exposed surface of the back-side redistribution structure 106 (including the back-side enhancement layer 140, if present). In some embodiments, top surfaces of the conductive connectors 152 are formed to be below the exposed surface of the back-side redistribution structure 106 (including the back-side enhancement layer, if present). Furthermore, a laser marking step may be performed on the exposed surface of the back-side redistribution structure 106 (e.g., the back-side enhancement layer 140 if present) to form identification marks (not shown).

Figure 20:
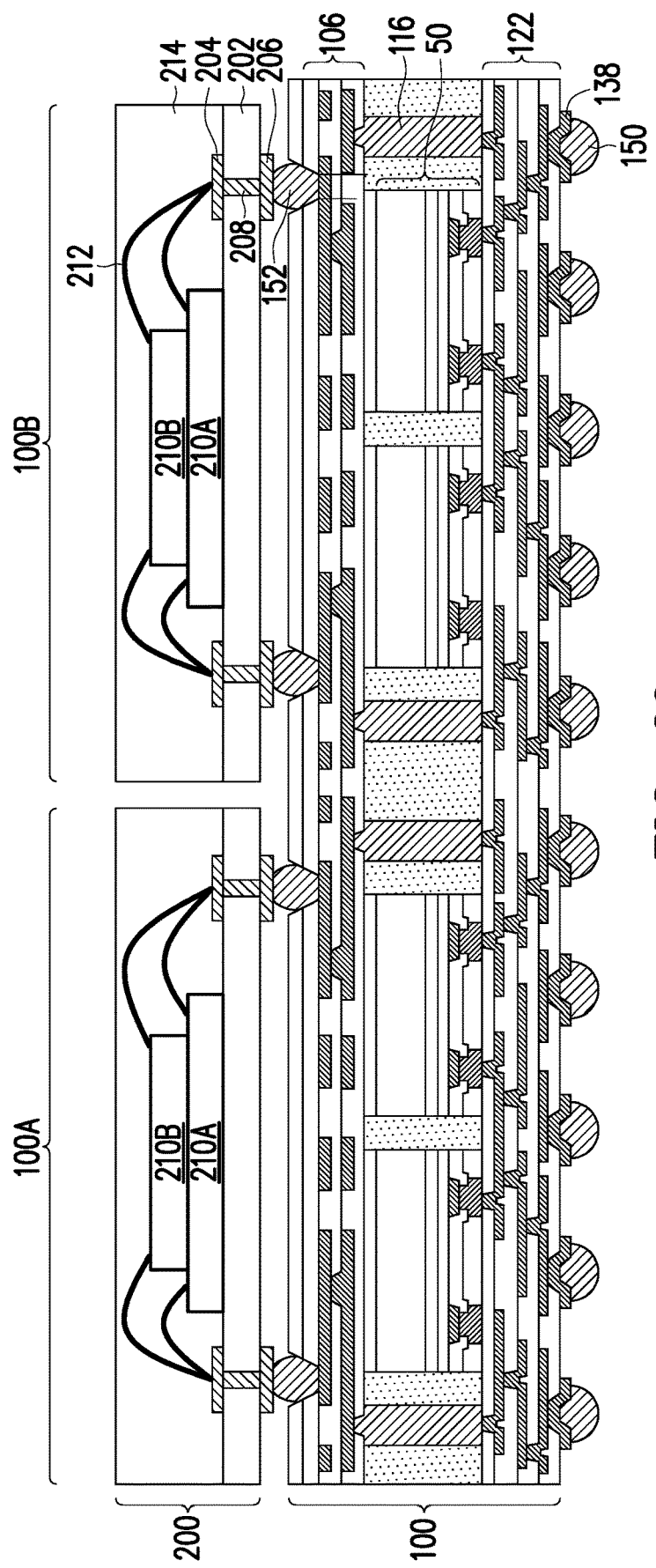
FIGS. 20, 21A, 21B, and 21C illustrate cross-sectional and top-down views of formation and implementation of device stacks in accordance with some embodiments.

FIGS. 20 and 21 illustrate formation and implementation of device stacks, in accordance with some embodiments. The device stacks are formed from the integrated circuit packages formed in the first package component 100. The device stacks may also be referred to as package-on-package (PoP) structures.

In FIG. 20, second package components 200 are coupled to the first package component 100. One of the second package components 200 is coupled in each of the package regions 100A and 100B to form an integrated circuit device stack in each region of the first package component 100.

The second package components 200 include, for example, a substrate 202 and one or more stacked dies 210 (e.g., 210A and 210B) coupled to the substrate 202. Although one set of stacked dies 210 (210A and 210B) is illustrated, in other embodiments, a plurality of stacked dies 210 (each having one or more stacked dies) may be disposed side-by-side coupled to a same surface of the substrate 202. The substrate 202 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate 202.

The substrate 202 may include active and passive devices (not shown). A wide variety of devices such as transistors, capacitors, resistors, combinations of these, and the like may be used to generate the structural and functional requirements of the design for the second package components 200. The devices may be formed using any suitable methods.

The substrate 202 may also include metallization layers (not shown) and the conductive vias 208. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate 202 is substantially free of active and passive devices.

The substrate 202 may have bond pads 204 on a first side of the substrate 202 to couple to the stacked dies 210, and bond pads 206 on a second side of the substrate 202, the second side being opposite the first side of the substrate 202, to couple to the conductive connectors 152. In some embodiments, the bond pads 204 and 206 are formed by forming recesses (not shown) into dielectric layers (not shown) on the first and second sides of the substrate 202. The recesses may be formed to allow the bond pads 204 and 206 to be embedded into the dielectric layers. In other embodiments, the recesses are omitted as the bond pads 204 and 206 may be formed on the dielectric layer. In some embodiments, the bond pads 204 and 206 include a thin seed layer (not shown) made of copper, titanium, nickel, gold, palladium, the like, or a combination thereof. The conductive material of the bond pads 204 and 206 may be deposited over the thin seed layer. The conductive material may be formed by an electrochemical plating process, an electroless plating process, CVD, atomic layer deposition (ALD), PVD, the like, or a combination thereof. In an embodiment, the conductive material of the bond pads 204 and 206 is copper, tungsten, aluminum, silver, gold, the like, or a combination thereof.

In some embodiments, the bond pads 204 and the bond pads 206 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 204 and 206. Any suitable materials or layers of material that may be used for the bond pads 204 and 206 are fully intended to be included within the scope of the current application. In some embodiments, the conductive vias 208 extend through the substrate 202 and couple at least one of the bond pads 204 to at least one of the bond pads 206.

In the illustrated embodiment, the stacked dies 210 are coupled to the substrate 202 by wire bonds 212, although other connections may be used, such as conductive bumps. In an embodiment, the stacked dies 210 are stacked memory dies. For example, the stacked dies 210 may be memory dies such as low-power (LP) double data rate (DDR) memory modules, such as LPDDR1, LPDDR2, LPDDR3, LPDDR4, or the like memory modules.

The stacked dies 210 and the wire bonds 212 may be encapsulated by a molding material 214. The molding material 214 may be molded on the stacked dies 210 and the wire bonds 212, for example, using compression molding. In some embodiments, the molding material 214 is a molding compound, a polymer, an epoxy, silicon oxide filler material, the like, or a combination thereof. A curing process may be performed to cure the molding material 214; the curing process may be a thermal curing, a UV curing, the like, or a combination thereof.

In some embodiments, the stacked dies 210 and the wire bonds 212 are buried in the molding material 214, and after the curing of the molding material 214, a planarization step, such as a grinding, is performed to remove excess portions of the molding material 214 and provide a substantially planar surface for the second package components 200.

After the second package components 200 are formed, the second package components 200 are mechanically and electrically bonded to the first package component 100 by way of the conductive connectors 152, the bond pads 206, and a metallization pattern of the back-side redistribution structure 106. In some embodiments, the stacked dies 210 may be coupled to the integrated circuit dies 50A and 50B through the wire bonds 212, the bond pads 204 and 206, the conductive vias 208, the conductive connectors 152, the back-side redistribution structure 106, the through vias 116, and the front-side redistribution structure 122.

In some embodiments, a solder resist (not shown) is formed on the side of the substrate 202 opposing the stacked dies 210. The conductive connectors 152 may be disposed in openings in the solder resist to be electrically and mechanically coupled to conductive features (e.g., the bond pads 206) in the substrate 202. The solder resist may be used to protect areas of the substrate 202 from external damage.

In some embodiments, the conductive connectors 152 have an epoxy flux (not shown) formed thereon before they are reflowed with at least some of the epoxy portion of the epoxy flux remaining after the second package components 200 are attached to the first package component 100.

In some embodiments, an underfill (not shown) is formed between the first package component 100 and the second package components 200, surrounding the conductive connectors 152. The underfill may reduce stress and protect the joints resulting from the reflowing of the conductive connectors 152. The underfill may be formed by a capillary flow process after the second package components 200 are attached, or may be formed by a suitable deposition method before the second package components 200 are attached. In embodiments where the epoxy flux is formed, it may act as the underfill.

Figure 21A:
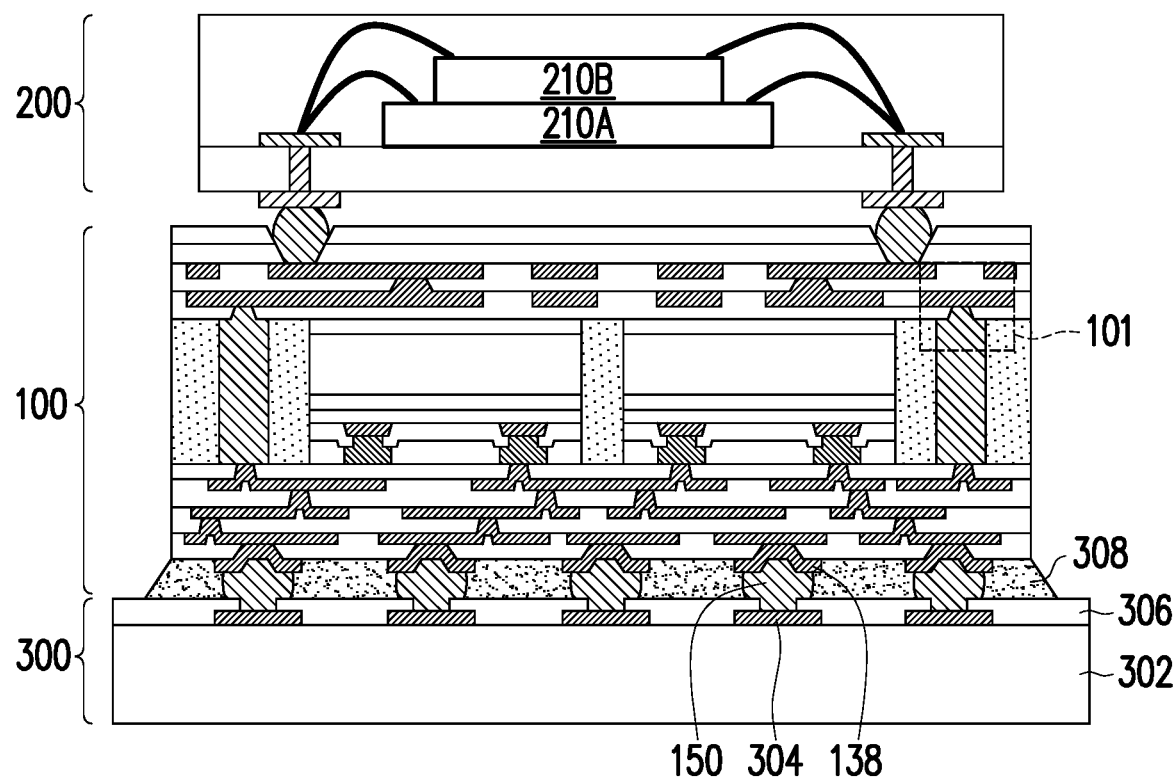

In FIG. 21A, a singulation process is performed by sawing along scribe line regions, e.g., between the first package region 100A and the second package region 100B. The sawing singulates the first package region 100A from the second package region 100B. The resulting, singulated device stack is from one of the first package region 100A or the second package region 100B. In some embodiments, the singulation process is performed after the second package components 200 are coupled to the first package component 100. In other embodiments (not shown), the singulation process is performed before the second package components 200 are coupled to the first package component 100, such as after the carrier substrate 102 is de-bonded and the conductive connectors 152 are formed.

Each singulated first package component 100 may then be mounted to a package substrate 300 using the conductive connectors 150. The package substrate 300 includes a substrate core 302 and bond pads 304 over the substrate core 302. The substrate core 302 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 302 may be an SOI substrate. Generally, an SOI substrate includes a layer of a semiconductor material such as epitaxial silicon, germanium, silicon germanium, SOI, SGOI, or combinations thereof. The substrate core 302 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 302.

The substrate core 302 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 302 may also include metallization layers and vias (not shown), with the bond pads 304 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 302 is substantially free of active and passive devices.

In some embodiments, the conductive connectors 150 are reflowed to attach the first package component 100 to the bond pads 304. The conductive connectors 150 electrically and/or physically couple the package substrate 300, including metallization layers in the substrate core 302, to the first package component 100. In some embodiments, a solder resist 306 is formed on the substrate core 302. The conductive connectors 150 may be disposed in openings in the solder resist 306 to be electrically and mechanically coupled to the bond pads 304. The solder resist 306 may be used to protect areas of the substrate 202 from external damage.

The conductive connectors 150 may have an epoxy flux (not shown) formed thereon before they are reflowed with at least some of the epoxy portion of the epoxy flux remaining after the first package component 100 is attached to the package substrate 300. This remaining epoxy portion may act as an underfill to reduce stress and protect the joints resulting from reflowing the conductive connectors 150. In some embodiments, an underfill 308 may be formed between the first package component 100 and the package substrate 300 and surrounding the conductive connectors 150. The underfill 308 may be formed by a capillary flow process after the first package component 100 is attached or may be formed by a suitable deposition method before the first package component 100 is attached.

In some embodiments, passive devices (e.g., surface mount devices (SMDs), not shown) may also be attached to the first package component 100 (e.g., to the UBMs 138) or to the package substrate 300 (e.g., to the bond pads 304). For example, the passive devices may be bonded to a same surface of the first package component 100 or the package substrate 300 as the conductive connectors 150. The passive devices may be attached to the package component 100 prior to mounting the first package component 100 on the package substrate 300, or may be attached to the package substrate 300 prior to or after mounting the first package component 100 on the package substrate 300.

The first package component 100 may be implemented in other device stacks. For example, a PoP structure is shown, but the first package component 100 may also be implemented in a Flip Chip Ball Grid Array (FCBGA) package. In such embodiments, the first package component 100 is mounted to a substrate such as the package substrate 300, but the second package component 200 is omitted. Instead, a lid or heat spreader may be attached to the first package component 100. When the second package component 200 is omitted, the back-side redistribution structure 106 and through vias 116 may also be omitted.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 21B:
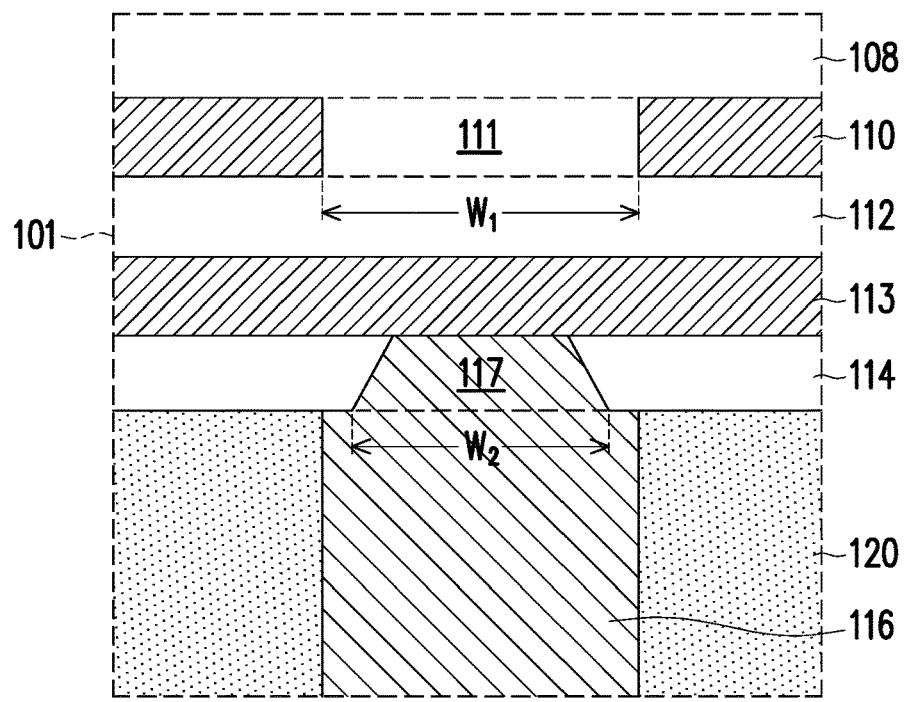

FIG. 21B illustrates a detailed cross-sectional view of region 101 as illustrated in FIG. 21A, in accordance with some embodiments. The dielectric slot 111 is over the conductive via 117 that extends from the through via 116. The first width $W_1$ of the dielectric slot 111 is larger than the second width $W_2$ of the conductive via 117.

Figure 21C:
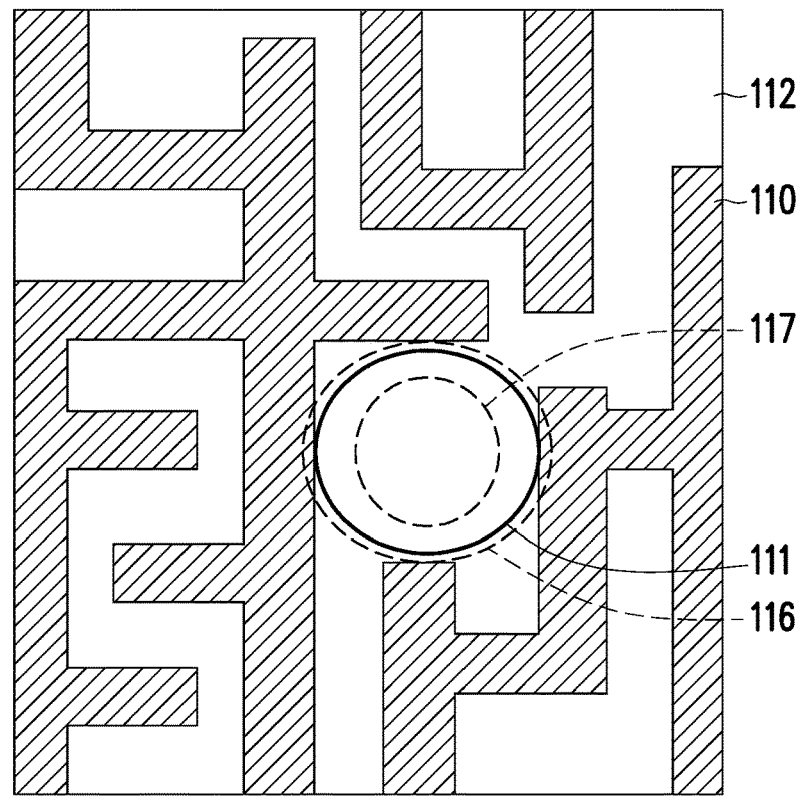

FIG. 21C illustrates a top-down view of the structure at a level of the metallization pattern 110, in accordance with some embodiments. As shown in FIG. 21C, the dielectric slot 111 overlaps the through-via 116 (shown as a dashed circle) and the conductive via 117 (shown as a dashed circle) in the top-down view.

FIGS. 22A through 25 illustrate cross-sectional views of intermediate steps during a process for forming a third package component 400, in accordance with some other embodiments. Elements of the third package component 400 may be similar to the first package component 100 described above in reference to FIGS. 2-19 where like reference numerals indicate like elements formed using like processes. As discussed in greater detail below, a back-side redistribution structure 406 is formed to include an adhesion layer. The adhesion layer may help reduce the stress incurred as a result of through vias being subsequently formed over the back-side redistribution structure 406, thereby preventing or reducing delamination between the various layers of the back-side redistribution structure 406.

Figure 22A:
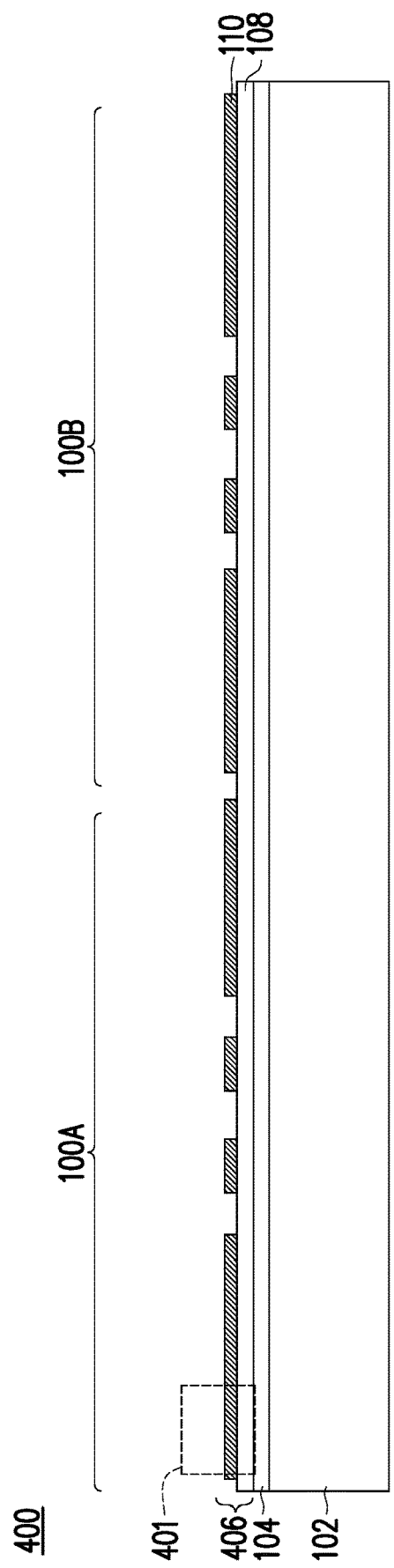
FIGS. 22A, 22B, 23A, 23B, 24, and 25 illustrate cross-sectional views of intermediate steps during a process for forming a package component in accordance with some embodiments.
Figure 22B:
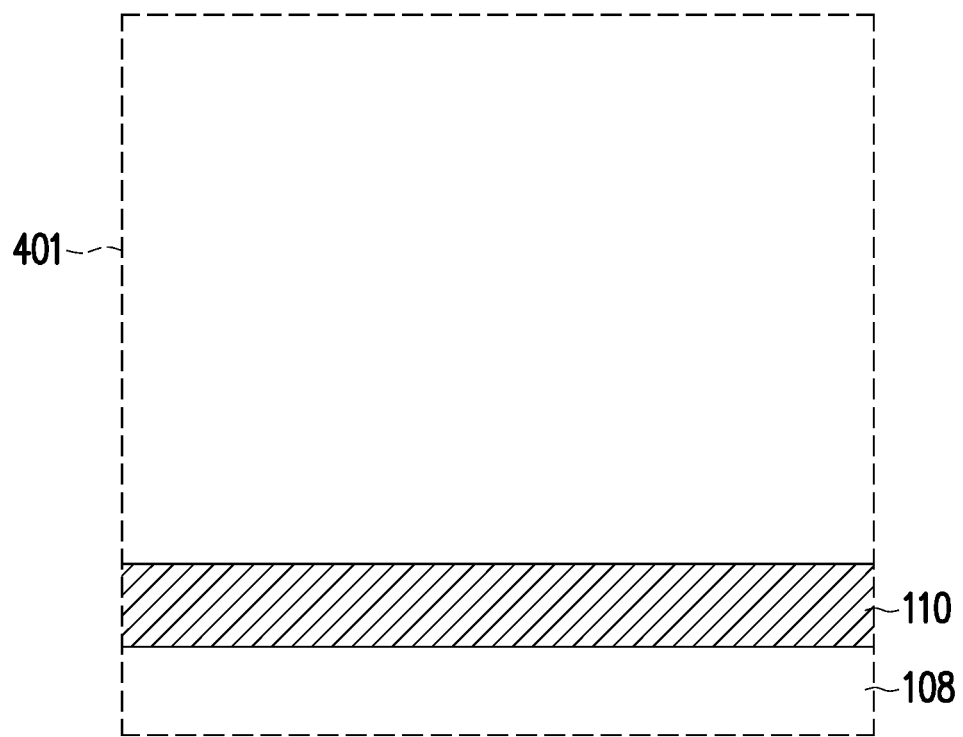

Referring first to FIGS. 22A and 22B, there is illustrated the formation of the dielectric layer 108 over the release layer 104, and the metallization pattern 110 over the dielectric layer 108. FIG. 22B illustrates a detailed cross-sectional view of region 401 as illustrated in FIG. 22A. The dielectric layer 108 and the metallization pattern 110 may be formed using similar methods and materials as described above with respect to FIGS. 3A-3C, and the details are not repeated herein. In some embodiments, conductive features of the metallization pattern 110 extend underneath subsequently formed through vias (see, e.g., through vias 116 in FIG. 25).

Figure 23A:
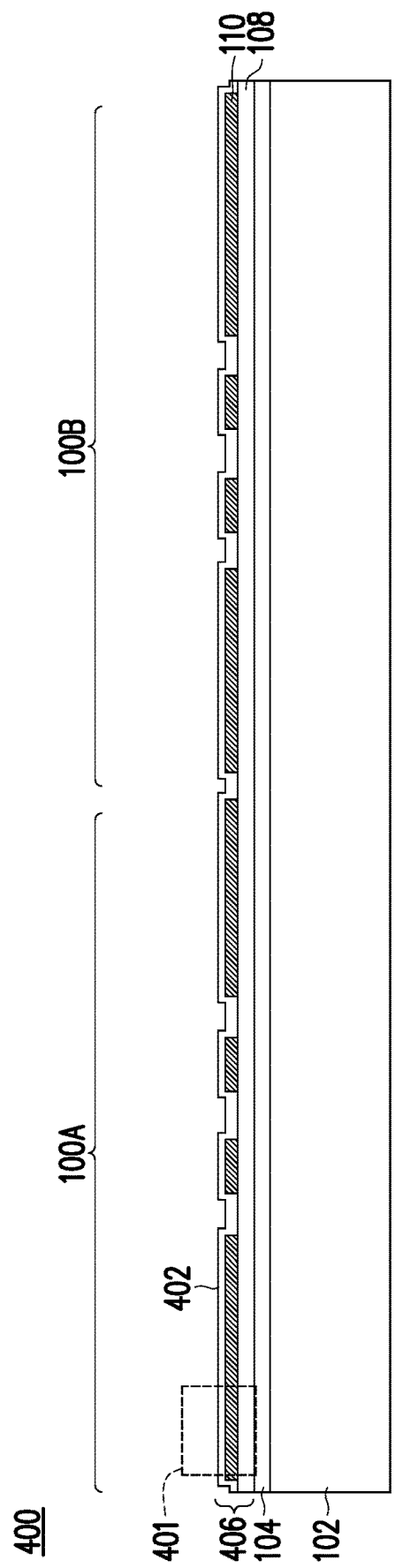
Figure 23B:
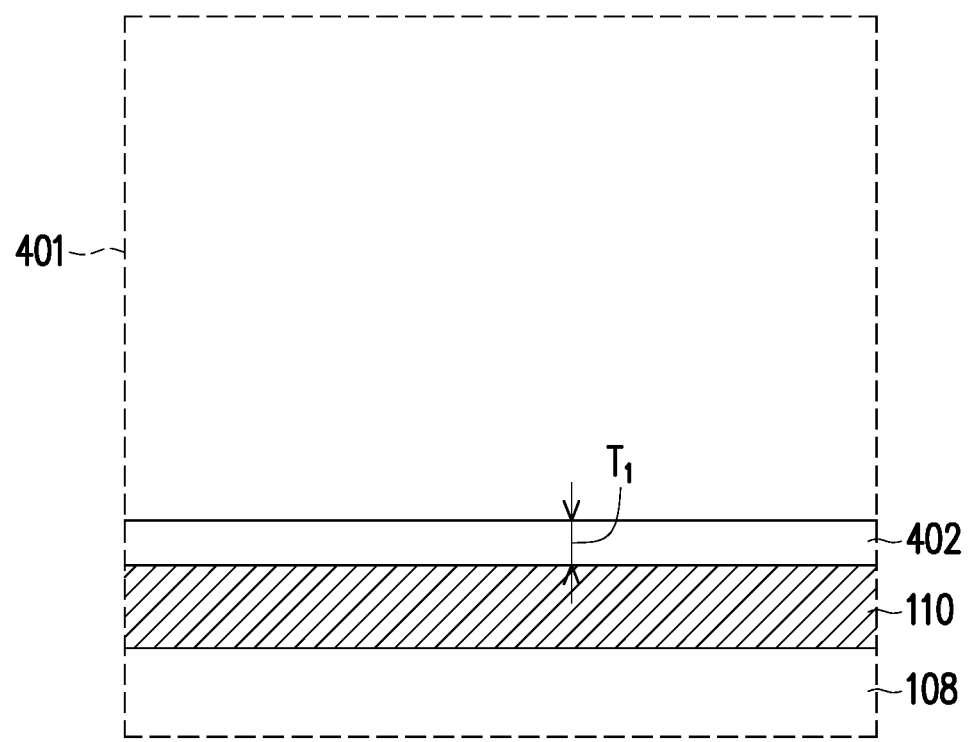

In FIGS. 23A-23B, an adhesion layer 402 is formed over the metallization pattern 110. The adhesion layer 402 increases adhesion between the metallization pattern 110 and a subsequently formed dielectric layer (see below, FIG. 24) and may reduce or prevent delamination between the various metallization patterns and dielectric layers of the back-side redistribution structure 406. Including the adhesion layer 402 in the back-side redistribution structure 406 may reduce areas of delamination between the metallization pattern 110 and the dielectric layer 112 underneath through vias 116 by a factor in a range of 50% to 60%.

The adhesion layer 402 may be formed by any acceptable deposition process, such as spin coating, CVD, laminating, the like, or a combination thereof. In some embodiments, the adhesion layer 402 comprises a polymer containing 1-Pyrroline, imidazole, the like, or a combination thereof.

In some embodiments, the adhesion layer 402 is formed to a first thickness $T_1$ in a range of 30 nm to 80 nm, which is advantageous for reducing or preventing delamination between the various metallization patterns and dielectric layers. In some embodiments, as illustrated in accordance with FIG. 23A, the adhesion layer 402 covers exposed surfaces of the metallization pattern 110 and the dielectric layer 108.

Figure 24:
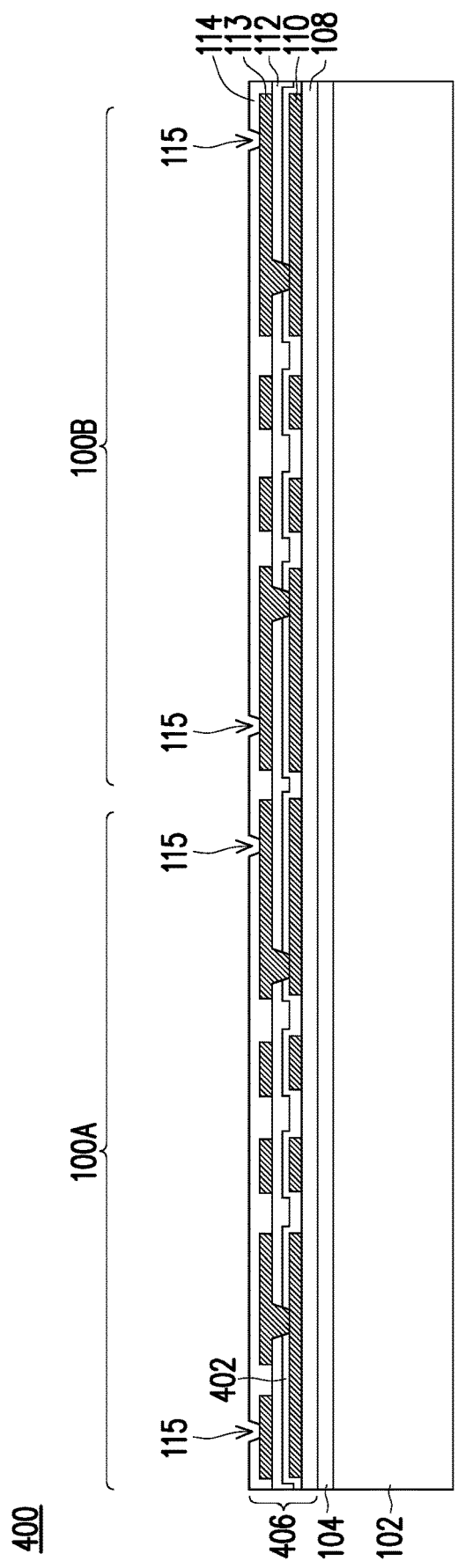

In FIG. 24, following from FIGS. 23A-23B, the back-side redistribution structure 406 is completed by forming the dielectric layer 112, the metallization pattern 113, and the dielectric layer 114. In some embodiments, the adhesion layer 402 is patterned together with the dielectric layer 112 using, e.g., an acceptable photolithography process. Conductive vias of the metallization pattern 113 are formed through the dielectric layer 112 and the adhesion layer 402 to physically and electrically couple with the metallization pattern 110. Openings 115 are formed through the dielectric layer 114 to expose portions of the metallization pattern 113. The dielectric layer 112, the metallization pattern 113, the dielectric layer 114, and the openings 115 may be formed with similar methods and materials as described above with respect to FIGS. 4A-6A, and the details are not repeated herein. In some embodiments, an additional adhesion layer 402 is formed over the metallization pattern 113. In embodiments in which the back-side redistribution structure 406 has additional levels of metallization patterns and dielectric layers, additional adhesion layers may be formed over any of the metallization patterns.

Figure 25:
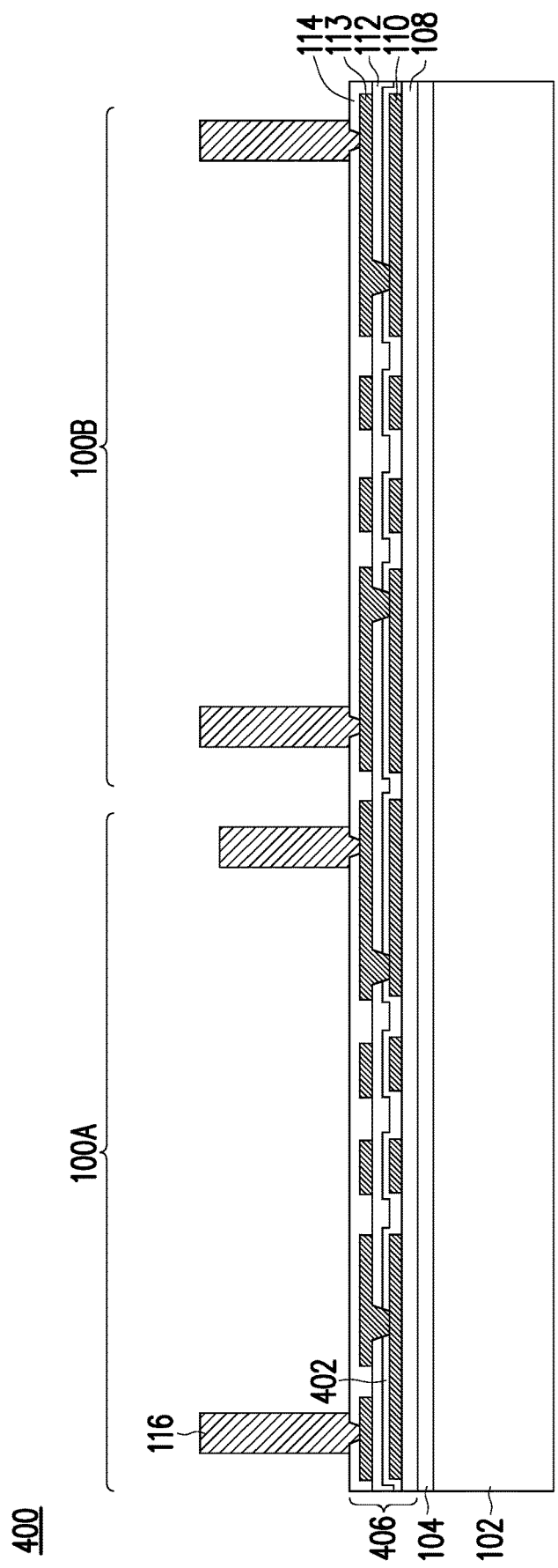

In FIG. 25, through vias 116 are formed in the openings 115 and extending away from the topmost dielectric layer of the back-side redistribution structure 406 (e.g., the dielectric layer 112). The through vias 116 may be formed with similar methods and materials as described above with respect to FIGS. 7A-7B. Subsequent steps of manufacturing the third package component 400 may be similar to steps for manufacturing the first package component 100 as described above with respect to FIGS. 8A-19, and the details are not repeated herein.

Figure 26A:
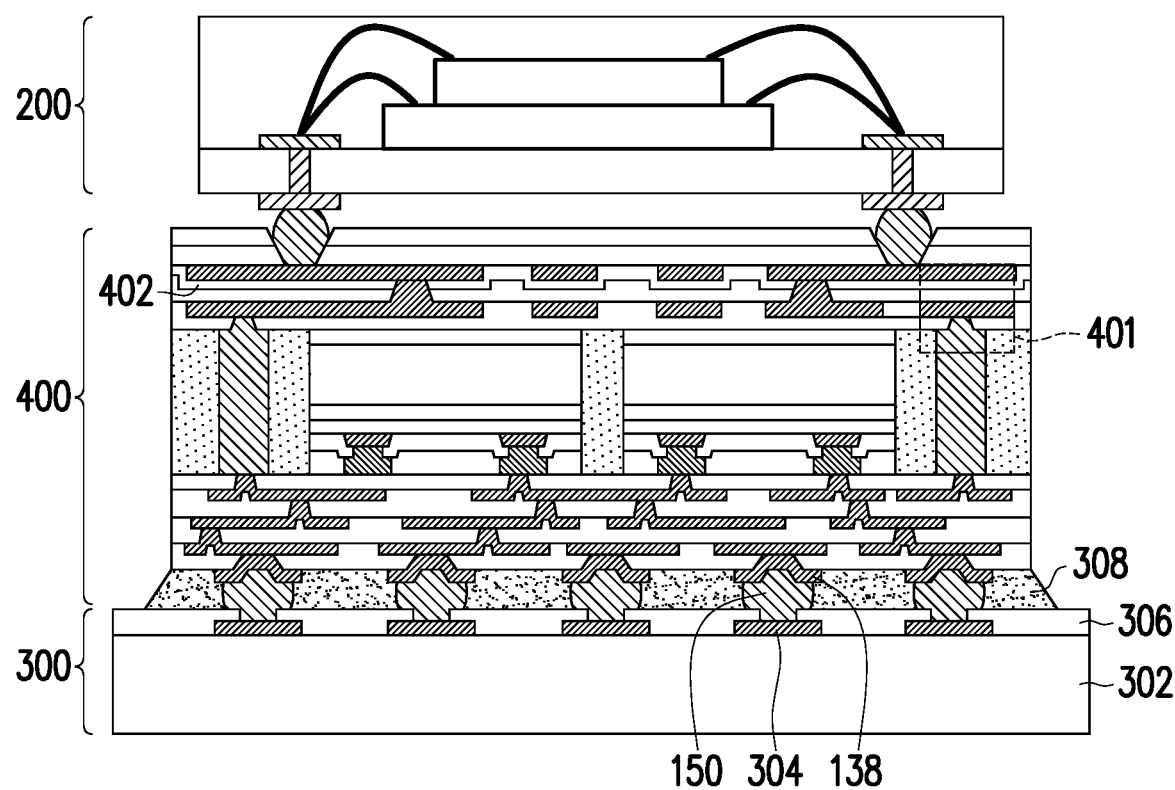
FIGS. 26A, 26B, and 26C illustrate cross-sectional and top-down views of formation and implementation of device stacks in accordance with some embodiments.
Figure 26B:
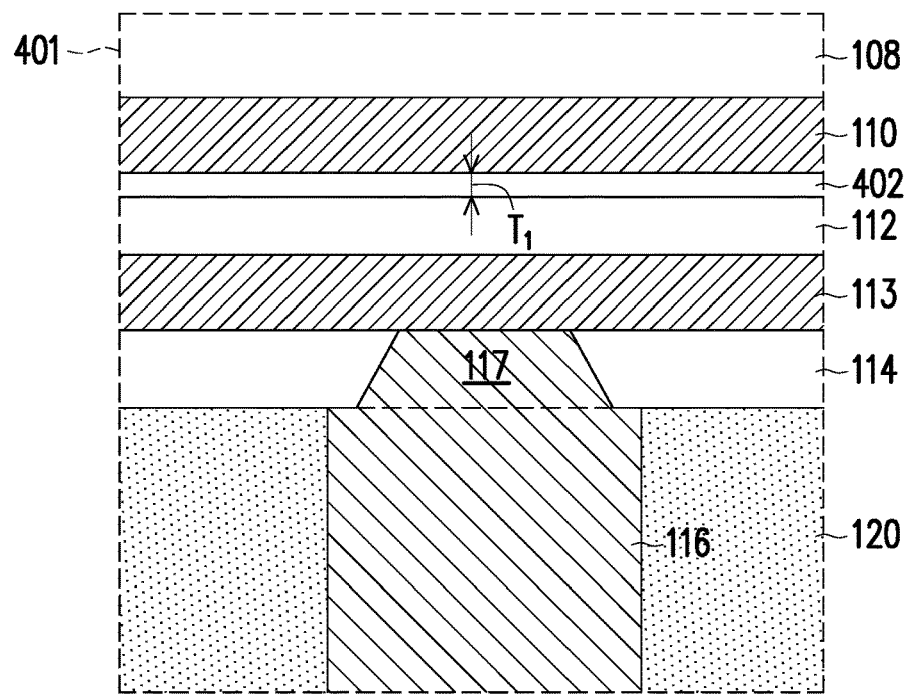
Figure 26C:
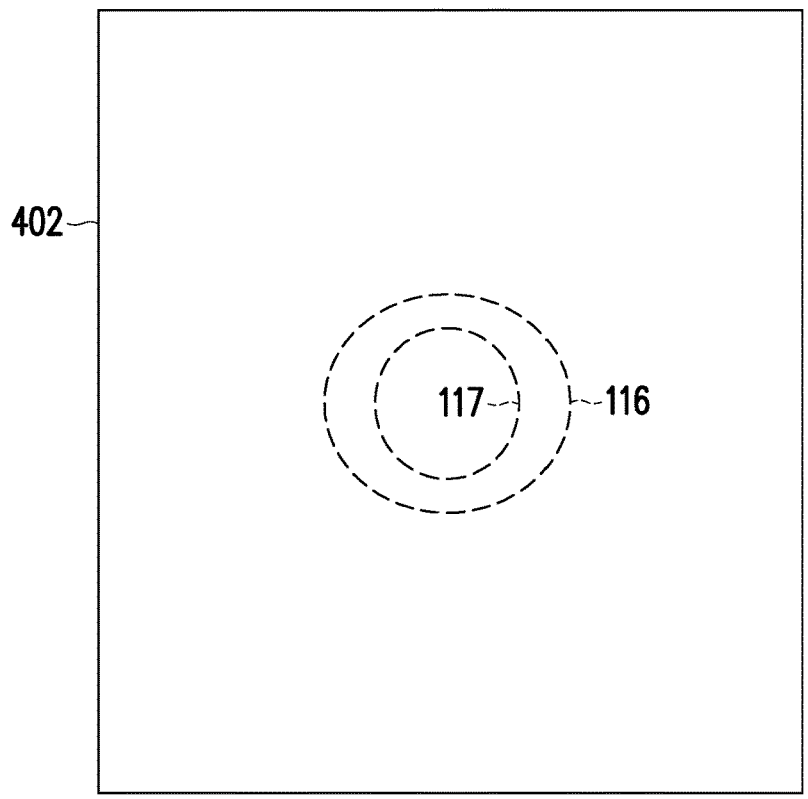

FIG. 26A illustrates a device stack formed from a singulated third package component 400 that has been coupled to a second package component 200 and mounted on a package substrate 300, in accordance with some embodiments. FIG. 26B illustrates a detailed cross-sectional view of region 401 as illustrated in FIG. 26A, in accordance with some embodiments. The device stack illustrated in FIGS. 26A-26B may be formed from the third package component 400 using similar methods and materials as described above with respect to FIGS. 20-21B, and the details are not repeated herein. The back-side redistribution structure 406 includes an adhesion layer 402 disposed between the metallization pattern 110 and the dielectric layer 112. FIG. 26C illustrates a top-down view of the structure at a level of the adhesion layer 402, in accordance with some embodiments. As shown in FIG. 26C, the adhesion layer 402 overlaps the through-via 116 (shown as a dashed circle) and the conductive via 117 (shown as a dashed circle) in the top-down view.

FIGS. 27A through 31 illustrate cross-sectional views of intermediate steps during a process for forming a fourth package component 500, in accordance with some other embodiments. The fourth package component 500 includes a back-side redistribution structure 506 having dielectric layers 508 and 512 with increased thicknesses or adjusted relative thicknesses. The fourth package component 500 may be similar to the first package component 100 described above in reference to FIGS. 2-19 where like reference numerals indicate like elements formed using like processes.

In FIGS. 27A through 30, a back-side redistribution structure 506 is formed on the release layer 104. In the embodiment shown, the back-side redistribution structure 506 includes one or more dielectric layers and metallization patterns (sometimes referred to as redistribution layers or redistribution lines) between adjacent ones of the dielectric layers. The back-side redistribution structure 506 includes dielectric layers with increased respective thicknesses and adjusted relative thicknesses with respect to each other. The increased respective thicknesses of the dielectric layers and the adjusted relative thicknesses of the dielectric layers with respect to each other may reduce the stress between various layers, such as between the layers of the metallization patterns and the dielectric layers of the back-side redistribution structure, thereby reducing delamination issues.

Figure 27A:
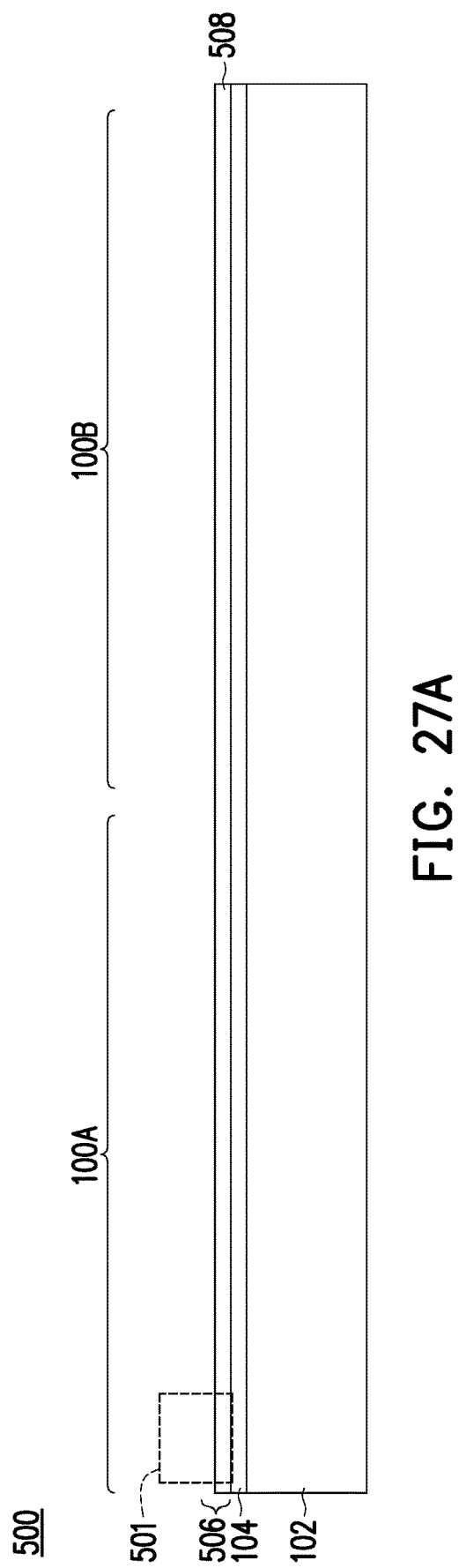
FIGS. 27A, 27B, 28A, 28B, 29A, 29B, 30A, 30B, and 31 illustrate cross-sectional views of intermediate steps during a process for forming a package component in accordance with some embodiments.
Figure 27B:
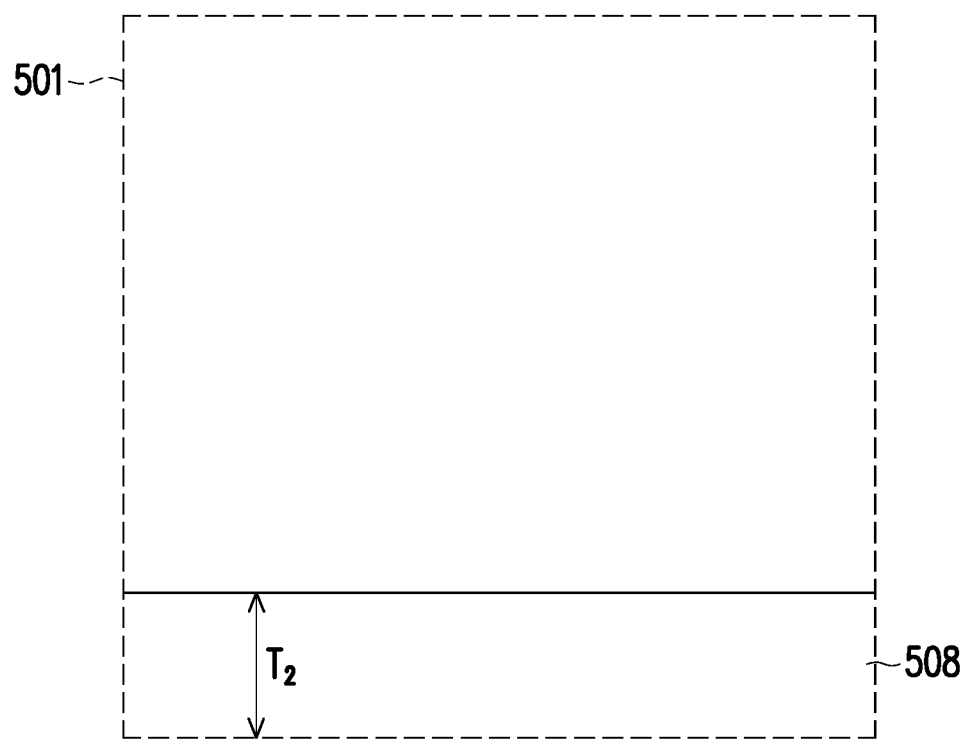

FIG. 27A illustrates the formation of the dielectric layer 508 over the release layer 104. FIG. 27B illustrates a detailed cross-sectional view of region 501 as illustrated in FIG. 27A. The dielectric layer 508 may be formed using similar methods and materials as described above for the dielectric layer 108 with respect to FIGS. 3A-3C, and the details are not repeated herein. In some embodiments, the dielectric layer 508 is formed to a second thickness $T_2$ in a range of 7.5 µm to 15 µm.

Figure 28A:
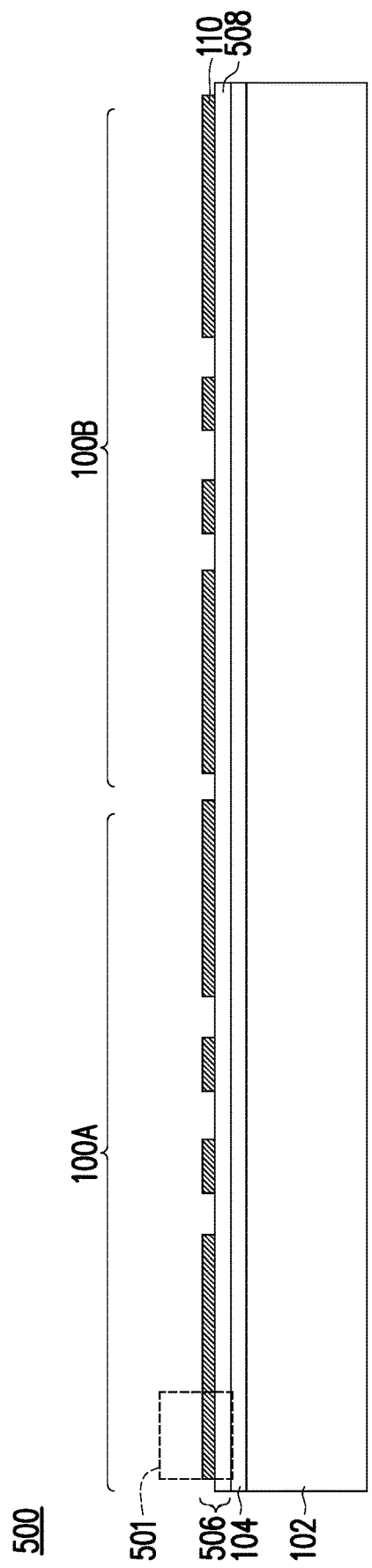
Figure 28B:
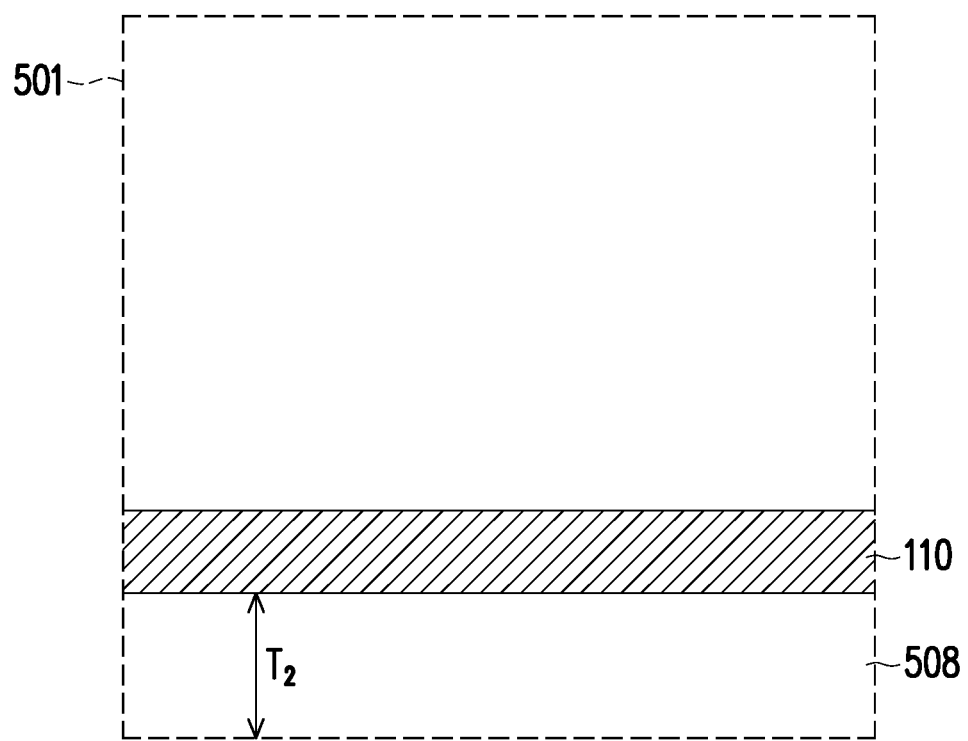

FIGS. 28A-28B illustrate the formation of the metallization pattern 110. The metallization pattern 110 may be formed using similar methods and materials as described above with respect to FIGS. 4A-4C, and the details are not repeated herein. In some embodiments, the metallization pattern 110 is not formed with regions 109 free of conductive material underneath subsequently formed through vias 116 (see below, FIG. 31).

Figure 29A:
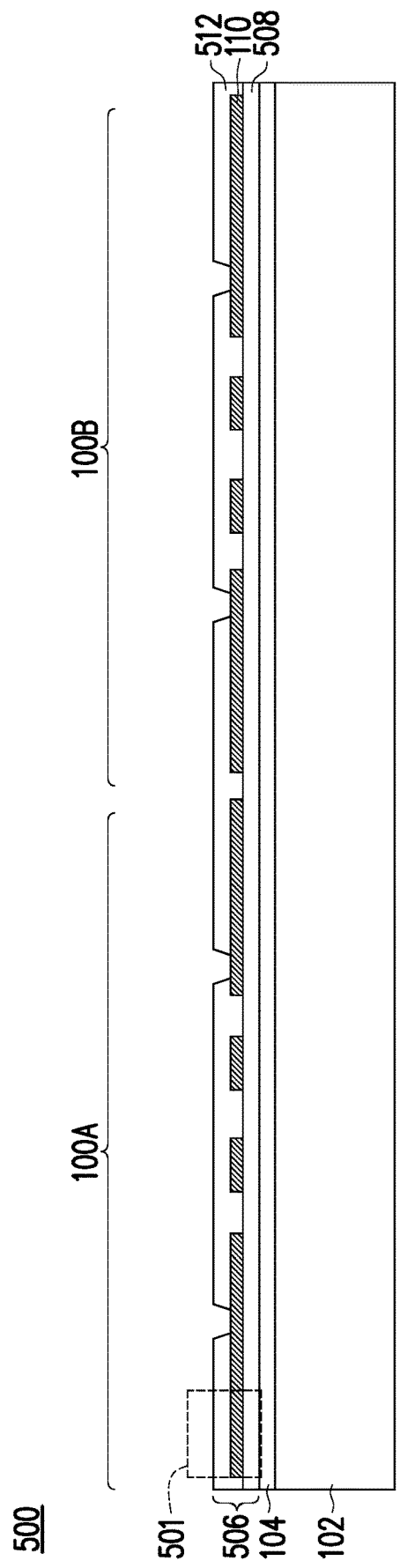
Figure 29B:
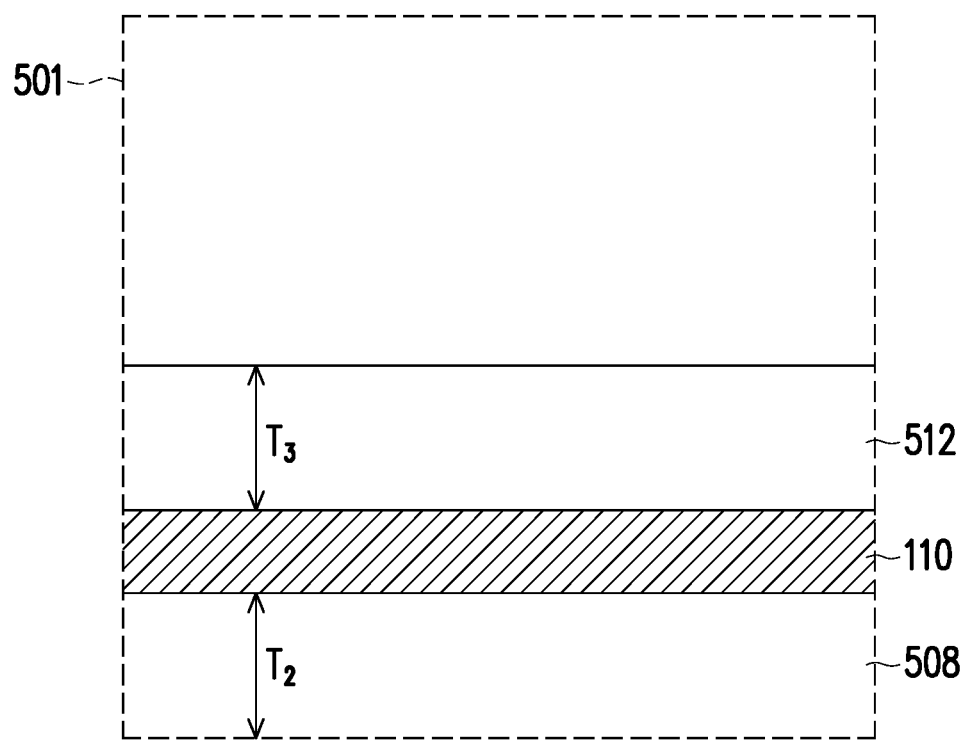

FIGS. 29A-29B illustrate the formation of the dielectric layer 512. The dielectric layer 512 may be formed using similar methods and materials as described above for the dielectric layer 112 with respect to FIGS. 4A-4B, and the details are not repeated herein. In some embodiments, the dielectric layer 512 is formed to a third thickness $T_3$ in a range of 7.5 µm to 15 µm.

By adjusting the ratio of the second thickness $T_2$ of the dielectric layer 512 to the third thickness $T_3$, stress between the metallization pattern 110 and the dielectric layer 512 at positions underneath the subsequently formed through vias 116 may be reduced. This may reduce or prevent areas of delamination between the metallization pattern 110 and the dielectric layer 512 underneath the subsequently formed through vias 116. In some embodiments, the ratio of the second thickness $T_2$ to the third thickness $T_3$ is 1 or greater, such as in a range of 1 to 3, which is advantageous for reducing or preventing delamination between the metallization pattern 110 and the dielectric layer 512. As an example, the ratio of $T_2:T_3$ being in a range of 1 to 3 may reduce stress on the dielectric layer 512 by up to 18% during high temperature processes such as subsequent curing of the encapsulant 120 (see above, FIGS. 9A-9B) performed at about 220° C. The ratio of $T_2:T_3$ being less than 1 may not sufficiently reduce stress between the metallization pattern 110 and the dielectric layer 512. The ratio of $T_2:T_3$ being greater than 3 may be disadvantageous by leading to increased package warpage or jagged edges of openings for conductive connectors formed through the dielectric layer 512 after, e.g., laser drilling (see above, FIG. 18).

Figure 30A:
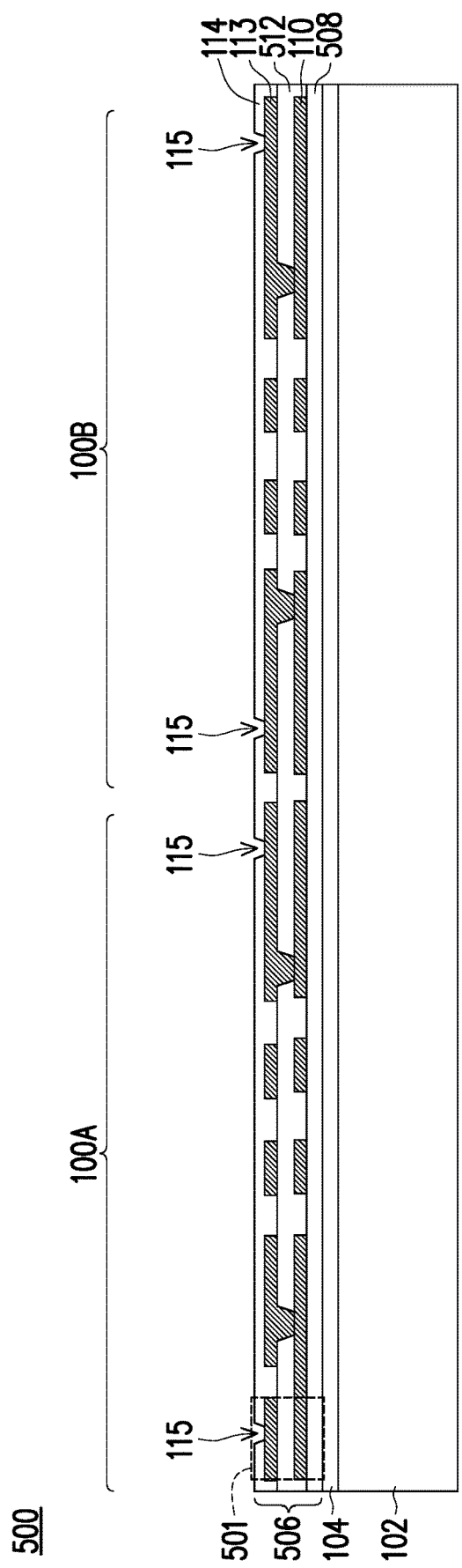
Figure 30B:
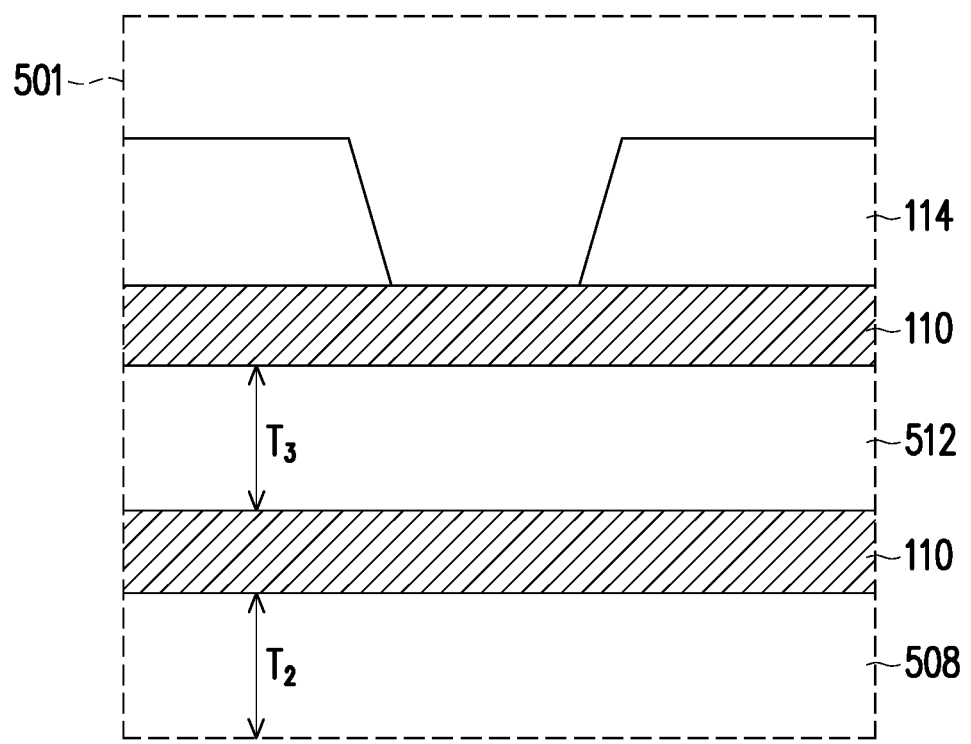

In FIG. 30A and 30B, the back-side redistribution structure 506 is completed by forming the metallization pattern 113 and the dielectric layer 114. Openings 115 are formed through the dielectric layer 114 to expose portions of the metallization pattern 113. The metallization pattern 113, the dielectric layer 114, and the openings 115 may be formed with similar methods and materials as described above with respect to FIGS. 5A-6A, and the details are not repeated herein.

Figure 31:
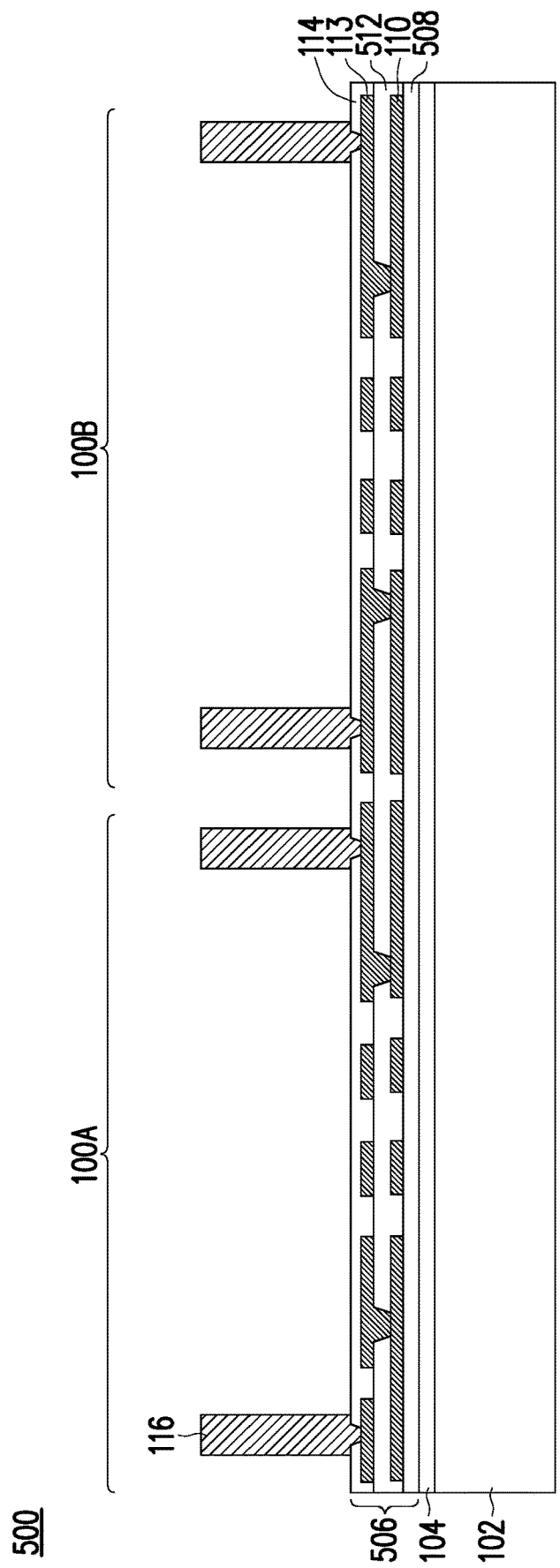

In FIG. 31, through vias 116 are formed in the openings 115 and extending away from the topmost dielectric layer of the back-side redistribution structure 506 (e.g., the dielectric layer 112). The through vias 116 may be formed with similar methods and materials as described above with respect to FIGS. 7A-7B. Subsequent steps of manufacturing the fourth package component 500 may be similar to steps for manufacturing the first package component 100 as described above with respect to FIGS. 8A-19, and the details are not repeated herein.

Figure 32A:
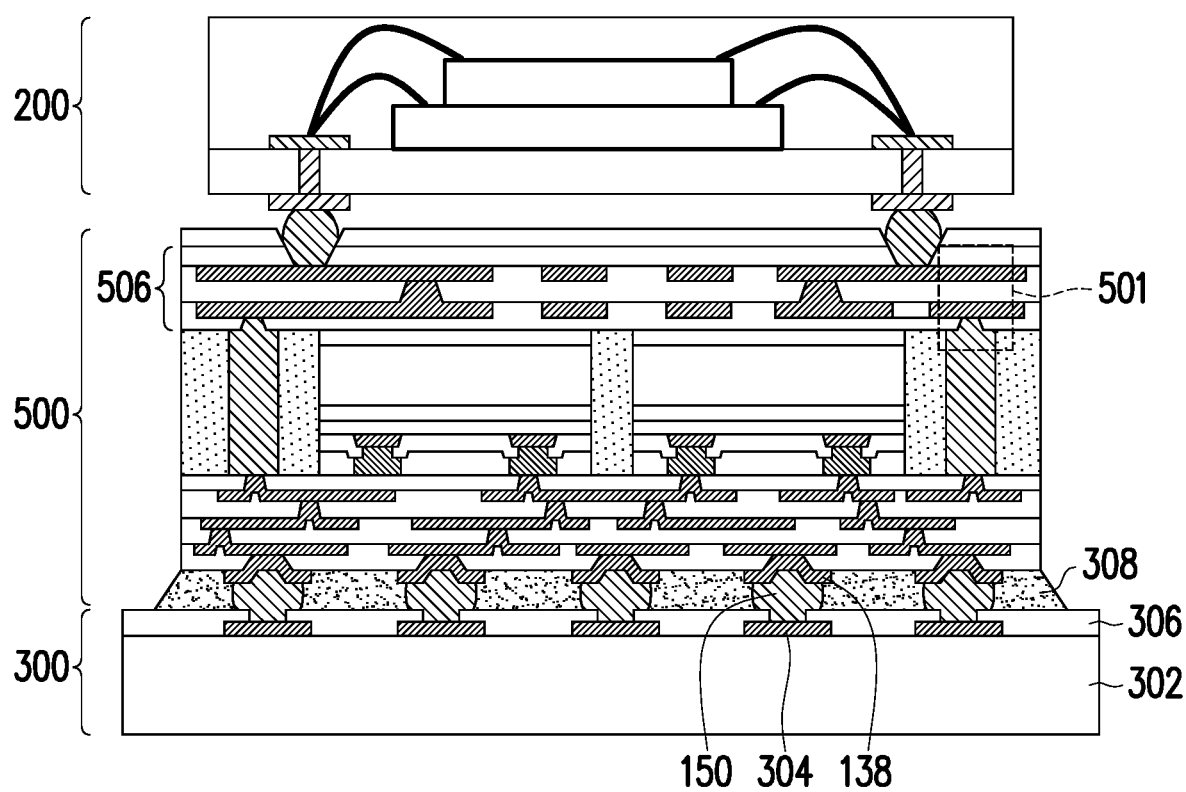
FIGS. 32A and 32B illustrate cross-sectional views of formation and implementation of device stacks in accordance with some embodiments.
Figure 32B:
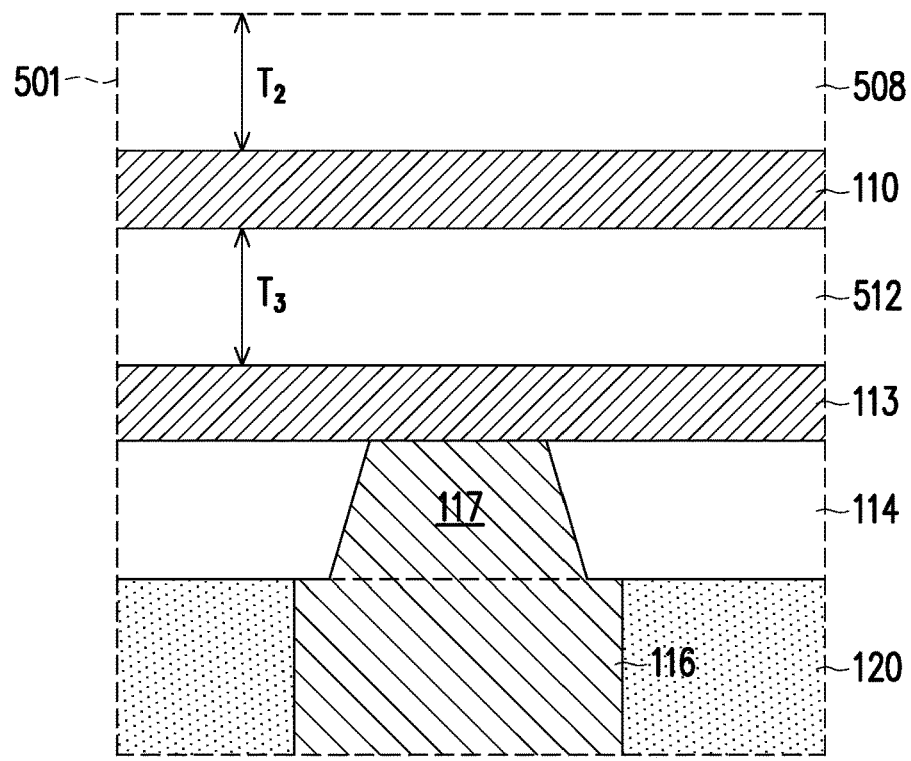

FIG. 32A illustrates a device stack formed from a singulated fourth package component 500 that has been coupled to a second package component 200 and mounted on a package substrate 300, in accordance with some embodiments. FIG. 32B illustrates a detailed cross-sectional view of region 501 as illustrated in FIG. 32A, in accordance with some embodiments. The device stack illustrated in FIGS. 32A-32B may be formed from the fourth package component 500 using similar methods and materials as described above with respect to FIGS. 20-21B, and the details are not repeated herein. The back-side redistribution structure 506 includes a dielectric layer 508 with a second thickness $T_2$ and a dielectric layer 512 with a third thickness $T_3$. In some embodiments, the ratio of the second thickness $T_2$ to the third thickness $T_3$ is in a range of 1 to 3.

Figure 33:
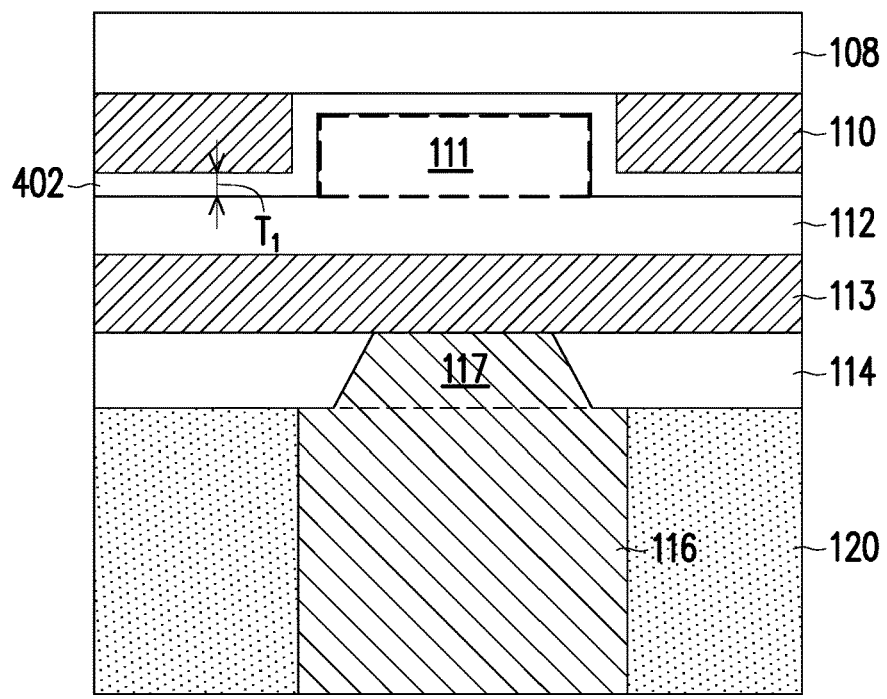
FIGS. 33 through 37A-37C illustrate cross-sectional and top-down views of formation and implementation of device stacks in accordance with some embodiments.
Figure 34:
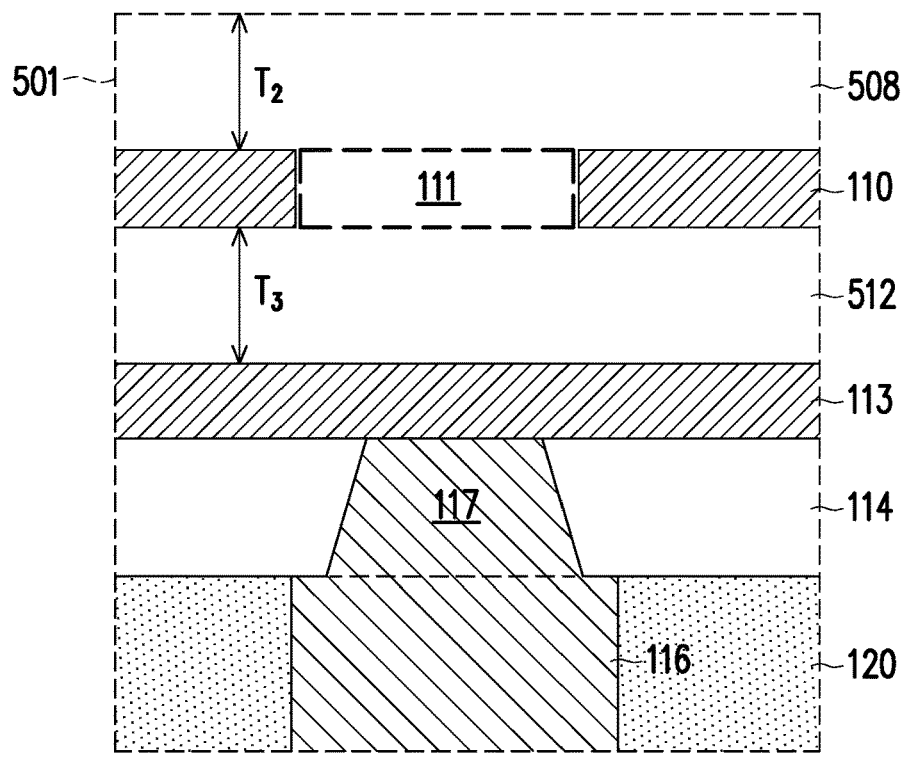
Figure 35:
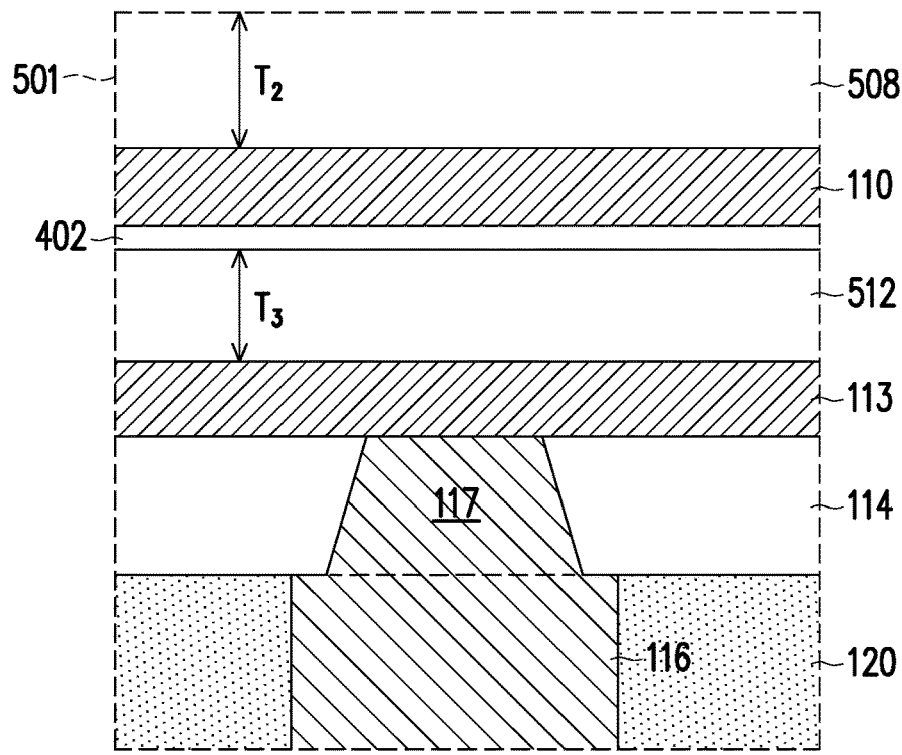
Figure 36:
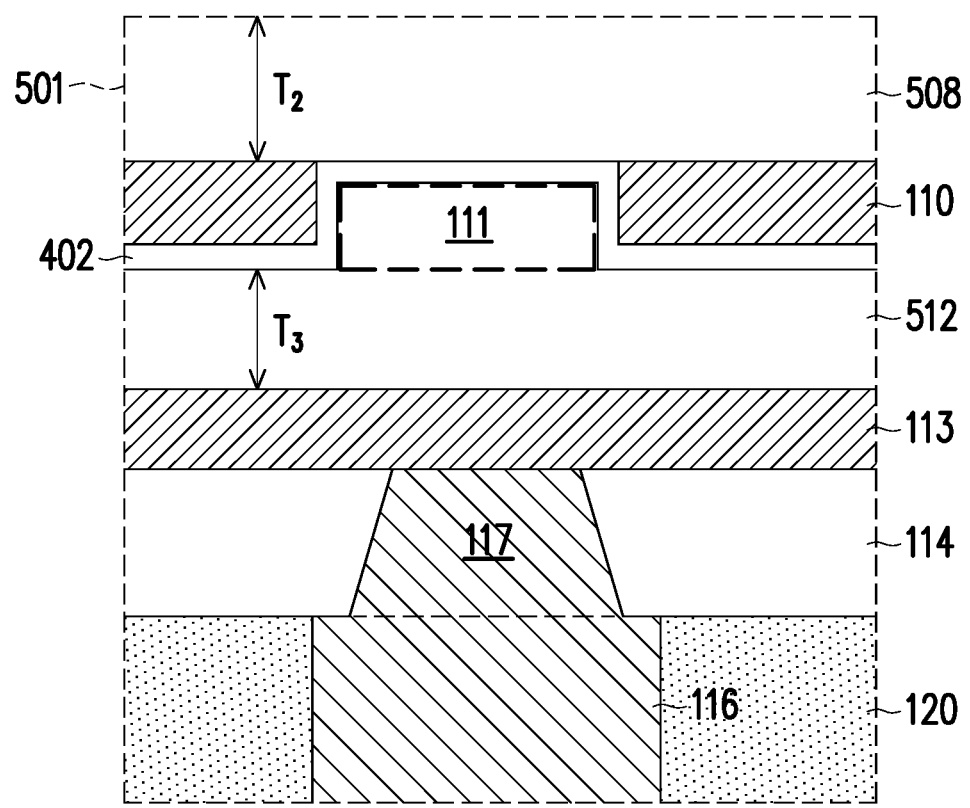

FIGS. 33 through 36 illustrate cross-sectional views of regions similar to region 101 (see above, FIGS. 21A-21B), region 401 (see above, FIGS. 26A-26B), and region 501 (see above, FIGS. 32A-32B) in embodiments having combinations of dielectric slots 111, adhesion layers 402, and dielectric layers 508 and 512 with increased thicknesses or adjusted relative thicknesses. FIG. 33 illustrates an embodiment with a dielectric slot 111 in the metallization pattern 110 with in an adhesion layer 402 over the metallization pattern 110. FIG. 34 illustrates an embodiment with a dielectric slot 111 in the metallization pattern 110 in combination with the dielectric layers 508 and 512 with increased thicknesses or adjusted relative thicknesses. FIG. 35 illustrates an embodiment with an adhesion layer 402 over the metallization pattern 110 in combination with the dielectric layers 508 and 512 with increased thicknesses or adjusted relative thicknesses. FIG. 36 illustrates an embodiment with a dielectric slot 111 in the metallization pattern 110 with the adhesion layer 402 over the metallization pattern, wherein dielectric layers 508 and 512 have increased thicknesses or adjusted relative thicknesses.

Figure 37A:
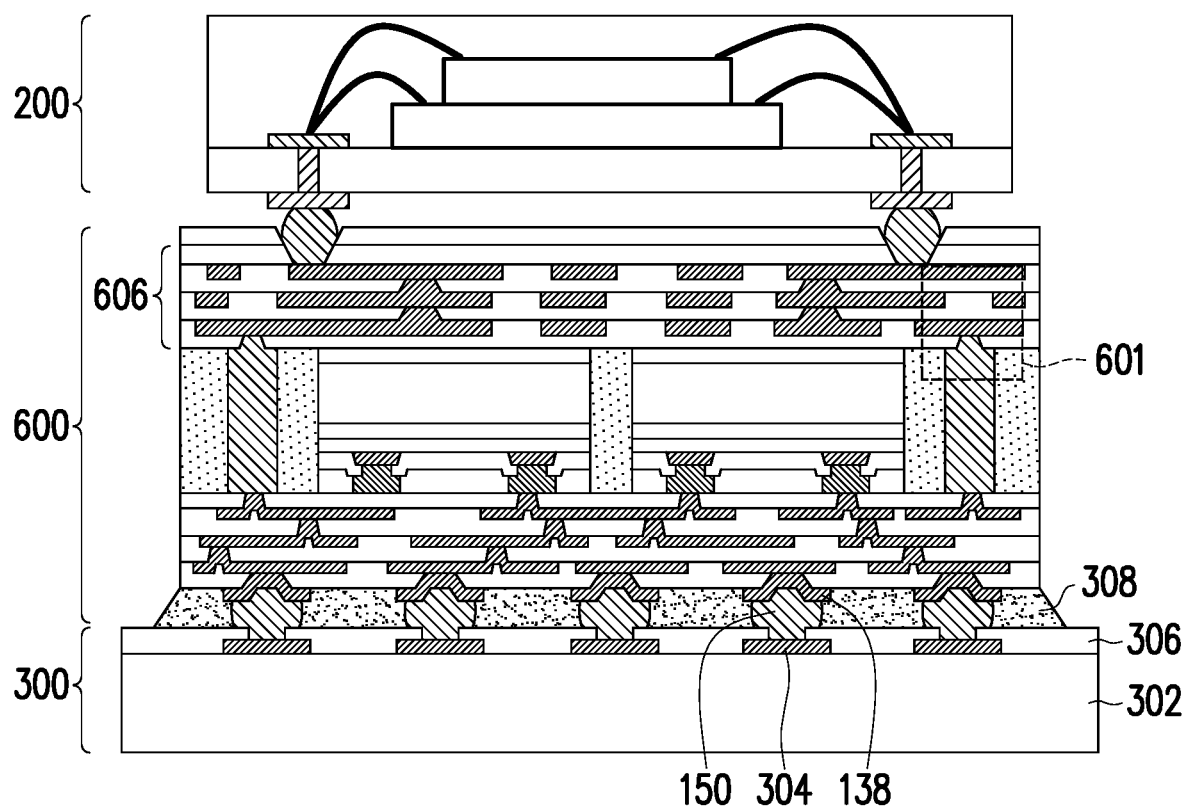
Figure 37B:
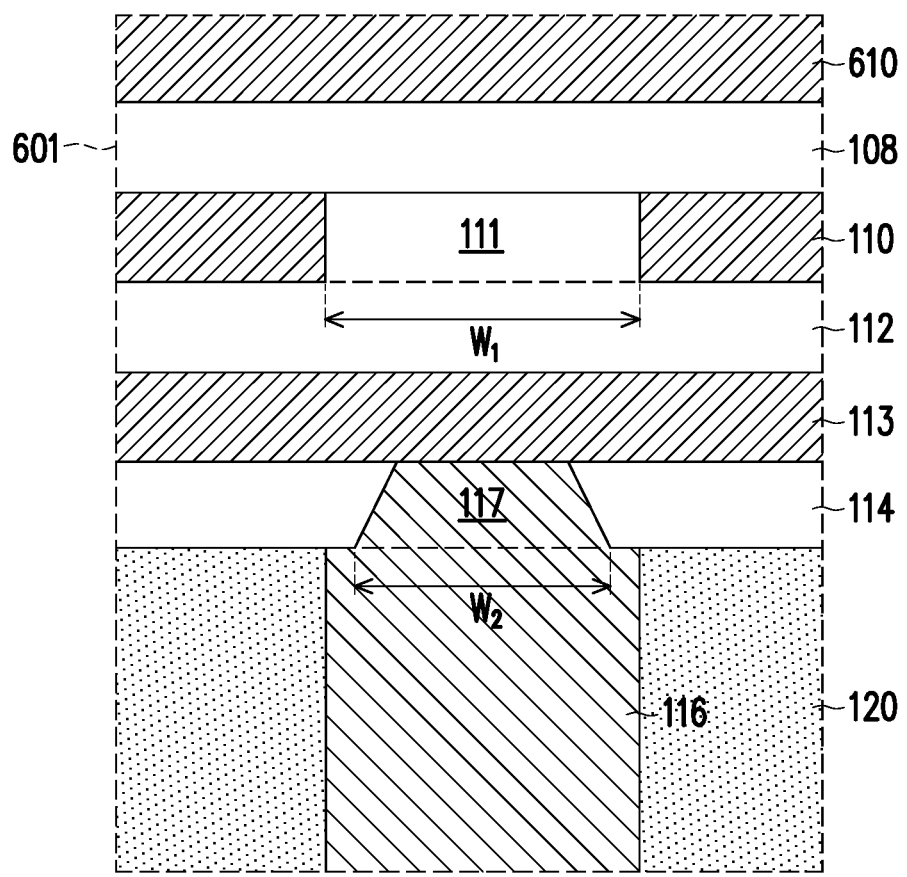
Figure 37C:
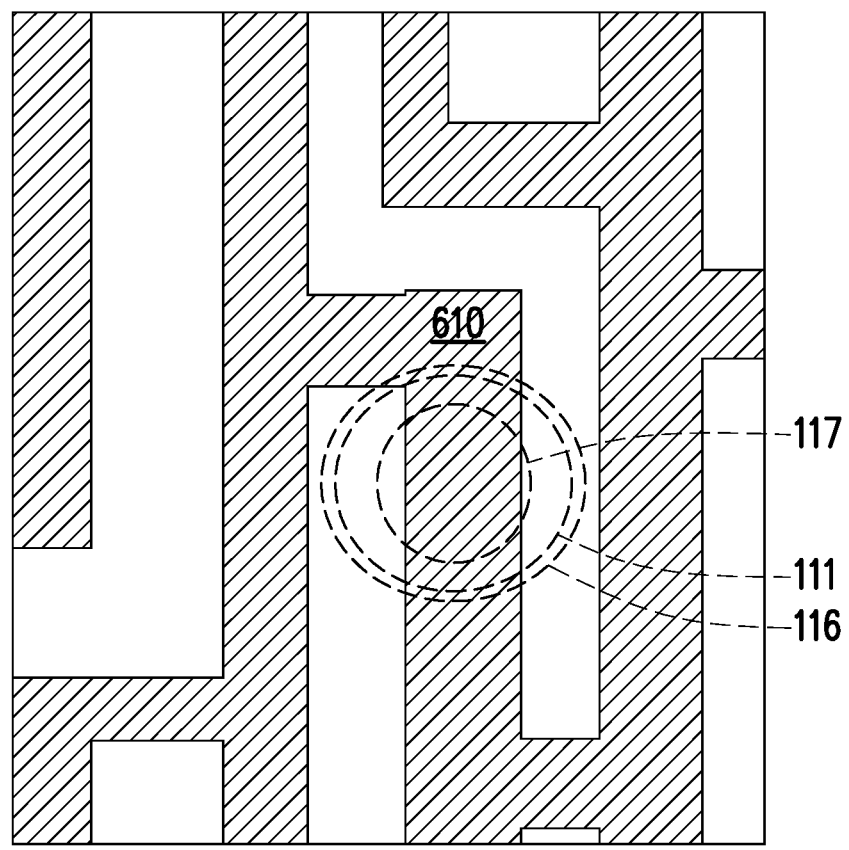

FIG. 37A illustrates a device stack formed from a singulated fifth package component 600 that has been coupled to a second package component 200 and mounted on a package substrate 300, in accordance with some embodiments. FIG. 37B illustrates a detailed cross-sectional view of region 601 as illustrated in FIG. 37A, in accordance with some embodiments. The fifth package component 600 includes a back-side redistribution structure 606 with four dielectric layers and three metallization patterns, which may be formed using similar methods and materials as the back-side redistribution structure 106 as described above with respect to FIGS. 3A-6B with the addition of one dielectric layer and one metallization pattern 610. The device stack illustrated in FIGS. 37A-37B may be formed from the fifth package component 600 using similar methods and materials as described above with respect to FIGS. 20-21B, and the details are not repeated herein. As shown in FIG. 32B, the back-side redistribution structure 606 includes a metallization pattern 610 above the dielectric layer 108, and conductive material of the metallization pattern 610 may be above the dielectric slot 111, over the footprint of the conductive via 117. FIG. 37C illustrates a top-down view of the structure at a level of the metallization pattern 610, in accordance with some embodiments. As shown in FIG. 37C, conductive material of the metallization pattern 610 overlaps the dielectric slot 111 (shown as a dashed circle), the through-via 116 (shown as a dashed circle), and the conductive via 117 (shown as a dashed circle) in the top-down view.

Embodiments may achieve advantages, such as reducing or preventing disadvantageous delamination between metallization patterns and dielectric layers of a back-side redistribution structure. Dielectric slots may be included in a metallization pattern below respective footprints of the through vias. An adhesion layer may be formed over a metallization pattern to increase adhesion with a subsequently formed dielectric layer. Relative thicknesses of dielectric layers of the back-side redistribution structure may be adjusted.

In accordance with an embodiment, a semiconductor package includes: a back-side redistribution structure, the back-side redistribution structure including: a first dielectric layer; a second dielectric layer on the first dielectric layer; a first metallization pattern between the first dielectric layer and the second dielectric layer, wherein the second dielectric layer extends through the first metallization pattern to form a dielectric slot; and a second metallization pattern, wherein the second dielectric layer is between the first metallization pattern and the second metallization pattern; a front-side redistribution structure; an encapsulant between the back-side redistribution structure and the front-side redistribution structure; and a through via extending through the encapsulant, the through via being physically coupled with the second metallization pattern, wherein the dielectric slot overlaps the through via in a top-down view. In an embodiment, the dielectric slot is in a dummy pattern of the first metallization pattern. In an embodiment, the dielectric slot has a first surface area in the top-down view, a rectangular dielectric region in the dummy pattern has a second surface area in the top-down view, and the first surface area is larger than the second surface area. In an embodiment, wherein the dielectric slot has a round shape in a top-down view. In an embodiment, the through via includes a conductive via extending into the back-side redistribution structure, the dielectric slot overlapping the conductive via in the top-down view. In an embodiment, the dielectric slot has a first width, the conductive via has a second width, and the first width is greater than the second width. In an embodiment, the back-side redistribution structure further includes a third metallization pattern, wherein the first dielectric layer is between the third metallization pattern and the first metallization pattern, wherein conductive material of the third metallization pattern overlaps the dielectric slot in the top-down view. In an embodiment, the back-side redistribution structure further includes an adhesion layer between the first metallization pattern and the second dielectric layer.

In accordance with another embodiment, a semiconductor package includes: a front-side redistribution structure; a back-side redistribution structure, the back-side redistribution structure including: a first dielectric layer; a first metallization pattern on the first dielectric layer; an adhesion layer on the first metallization pattern, wherein the first metallization pattern is between the adhesion layer and the first dielectric layer, wherein a portion of the adhesion layer overlaps the through via in a top-down view; a second dielectric layer on the adhesion layer, wherein the adhesion layer is between the second dielectric layer and the first metallization pattern; and a second metallization pattern on the second dielectric layer, wherein the second dielectric layer is between the second metallization pattern and the adhesion layer; an integrated circuit die electrically coupled to the front-side redistribution structure, the integrated circuit die being between the front-side redistribution structure and the back-side redistribution structure; an encapsulant extending around the integrated circuit die; and a through via extending through the encapsulant, the through via electrically coupling the front-side redistribution structure to the back-side redistribution structure. In an embodiment, the adhesion layer includes 1-Pyrroline. In an embodiment, a conductive via of the second metallization pattern extends through the adhesion layer to physically contact the first metallization pattern. In an embodiment, the first dielectric layer has a first thickness, the second dielectric layer has a second thickness, and a ratio of the first thickness to the second thickness is 1 or greater. In an embodiment, the back-side redistribution structure further includes a dielectric slot through the first metallization pattern, the dielectric slot overlapping the through via in a top-down view.

In accordance with yet another embodiment, a method of manufacturing a semiconductor package includes: depositing a first dielectric layer over a carrier substrate; forming a first metallization pattern over the first dielectric layer, wherein the first metallization pattern has a first opening exposing the first dielectric layer; depositing a second dielectric layer over the first metallization pattern, wherein depositing the second dielectric layer forms a dielectric slot through the first metallization pattern by filling the first opening; forming a second metallization pattern over the second dielectric layer; depositing a third dielectric layer over the second metallization pattern; and forming a through via over the third dielectric layer, wherein the dielectric slot is laterally under the through via. In an embodiment, forming the through via includes forming a conductive via through the third dielectric layer, the conductive via overlying the dielectric slot. In an embodiment, the dielectric slot has a first width, the conductive via has a second width, and the first width is greater than the second width. In an embodiment, the method further includes forming an adhesion layer over the first metallization pattern, wherein the second dielectric layer is subsequently deposited over the adhesion layer, wherein forming the second metallization pattern includes forming a second opening through the second dielectric layer and the adhesion layer. In an embodiment, the adhesion layer includes a polymer. In an embodiment, the first dielectric layer has a first thickness, the second dielectric layer has a second thickness, and a ratio of the first thickness to the second thickness is in a range of 1 to 3. In an embodiment, the method further includes: adhering an integrated circuit die to the third dielectric layer; encapsulating the integrated circuit die and the through via with an encapsulant; and forming a front-side redistribution structure over the integrated circuit die, the through via, and the encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a back-side redistribution structure, the back-side redistribution structure comprising:
   a first dielectric layer;
   a second dielectric layer on the first dielectric layer;
   a first metallization pattern between the first dielectric layer and the second dielectric layer, wherein the second dielectric layer extends through the first metallization pattern to form a dielectric slot; and
   a second metallization pattern, wherein the second dielectric layer is between the first metallization pattern and the second metallization pattern;
   a front-side redistribution structure;
   an encapsulant between the back-side redistribution structure and the front-side redistribution structure; and
   a through via extending through the encapsulant, the through via being physically coupled with the second metallization pattern by a conductive via extending into the back-side redistribution structure, wherein the dielectric slot overlaps the through via in a top-down view, and wherein the conductive via is surrounded by the dielectric slot in the top-down view.

2. The semiconductor package of claim 1, wherein the dielectric slot is in a dummy pattern of the first metallization pattern.

3. The semiconductor package of claim 2, wherein the dielectric slot has a first surface area in the top-down view, a rectangular dielectric region in the dummy pattern has a second surface area in the top-down view, and the first surface area is larger than the second surface area.

4. The semiconductor package of claim 1, wherein the dielectric slot has a round shape in a top-down view.

5. The semiconductor package of claim 1, wherein the dielectric slot has a first width, the conductive via has a second width, and the first width is greater than the second width.

6. The semiconductor package of claim 1, wherein the back-side redistribution structure further comprises a third metallization pattern, wherein the first dielectric layer is between the third metallization pattern and the first metallization pattern, wherein conductive material of the third metallization pattern overlaps the dielectric slot in the top-down view.

7. The semiconductor package of claim 1, wherein the back-side redistribution structure further comprises an adhesion layer between the first metallization pattern and the second dielectric layer.

8. The semiconductor package of claim 7, wherein the adhesion layer comprises imidazole.

9. A semiconductor package, comprising:
a front-side redistribution structure;
a back-side redistribution structure, the back-side redistribution structure comprising:
a first dielectric layer;
a first metallization pattern on the first dielectric layer;
an adhesion layer on the first metallization pattern, wherein the first metallization pattern is between the adhesion layer and the first dielectric layer;
a second dielectric layer on the adhesion layer, wherein the adhesion layer is between the second dielectric layer and the first metallization pattern; and
a second metallization pattern on the second dielectric layer, wherein the second dielectric layer is between the second metallization pattern and the adhesion layer;
an integrated circuit die electrically coupled to the front-side redistribution structure, the integrated circuit die being between the front-side redistribution structure and the back-side redistribution structure;
an encapsulant extending around the integrated circuit die; and
a through via extending through the encapsulant, the through via electrically coupling the front-side redistribution structure to the back-side redistribution structure, wherein a portion of the adhesion layer overlaps the through via in a top-down view.

10. The semiconductor package of claim 9, wherein the adhesion layer comprises 1-Pyrroline.

11. The semiconductor package of claim 9, wherein a conductive via of the second metallization pattern extends through the adhesion layer to physically contact the first metallization pattern.

12. The semiconductor package of claim 9, wherein the first dielectric layer has a first thickness, the second dielectric layer has a second thickness, and a ratio of the first thickness to the second thickness is 1 or greater.

13. The semiconductor package of claim 9, wherein the back-side redistribution structure further comprises a dielectric slot through the first metallization pattern, the dielectric slot overlapping the through via in a top-down view.

14. A semiconductor package, comprising:
a first redistribution structure, the first redistribution structure comprising:
a first dielectric layer;
a first conductive feature and a second conductive feature on the first dielectric layer;
a second dielectric layer, wherein a first portion of the second dielectric layer is on the first conductive feature and the second conductive feature, and wherein a second portion of the second dielectric layer is between the first conductive feature and the second conductive feature; and
a third conductive feature on the second dielectric layer; and
a conductive via connected to the third conductive feature, wherein the conductive via is laterally underneath the second portion of the second dielectric layer, and wherein the second portion of the second dielectric layer has a first width and the conductive via has a second width smaller than the first width.

15. The semiconductor package of claim 14, further comprising an adhesion layer, wherein the adhesion layer is between the first conductive feature and the second dielectric layer, and wherein the adhesion layer is between the second conductive feature and the second dielectric layer.

16. The semiconductor package of claim 15, wherein the adhesion layer is between the first dielectric layer and the second dielectric layer.

17. The semiconductor package of claim 15, wherein the adhesion layer comprises a polymer.

18. The semiconductor package of claim 14, wherein the first dielectric layer has a first thickness and the second dielectric layer has a second thickness, and wherein a ratio of the first thickness to the second thickness is in a range from 1 to 3.

19. The semiconductor package of claim 14, further comprising a second redistribution structure and an encapsulant between the first redistribution structure and the second redistribution structure, wherein the conductive via extends through the encapsulant.

20. The semiconductor package of claim 14, wherein the second portion of the second dielectric layer has a circular shape in a top-down view.

* * * * *